(12) United States Patent
Koduri et al.

(10) Patent No.: US 12,389,730 B2
(45) Date of Patent: Aug. 12, 2025

(54) INTEGRATED CIRCUIT DEVICE PACKAGE

(71) Applicant: Texas Instruments Incorporated, Dallas, TX (US)

(72) Inventors: Sreenivasan Kalyani Koduri, Allen, TX (US); Grimmett Dale Jacky, Prosper, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 478 days.

(21) Appl. No.: 17/495,541

(22) Filed: Oct. 6, 2021

(65) Prior Publication Data
US 2022/0109091 A1     Apr. 7, 2022

Related U.S. Application Data

(60) Provisional application No. 63/087,944, filed on Oct. 6, 2020.

(51) Int. Cl.
| | |
|---|---|
| *H01L 23/00* | (2006.01) |
| *H10F 77/00* | (2025.01) |
| *H10F 77/50* | (2025.01) |
| *H10H 20/85* | (2025.01) |
| *H10H 20/857* | (2025.01) |
| *H01L 31/02* | (2006.01) |
| *H01L 33/48* | (2010.01) |
| *H01L 33/62* | (2010.01) |

(52) U.S. Cl.
CPC .......... *H10H 20/857* (2025.01); *H10F 77/50* (2025.01); *H10F 77/933* (2025.01); *H10H 20/8506* (2025.01)

(58) Field of Classification Search
CPC ............... H01L 33/62; H01L 31/0203; H01L 31/02005; H01L 24/24; G02B 6/426; G02B 6/4257; G02B 6/4256; G02B 6/4262; H10K 30/80
See application file for complete search history.

(56) References Cited

U.S. PATENT DOCUMENTS

| | | | | |
|---|---|---|---|---|
| 8,564,702 B2 * | 10/2013 | Takagi | ............. | H04N 23/54 348/340 |
| 10,678,006 B2 * | 6/2020 | Rosenberg | ............. | G02B 6/428 |
| 2004/0201792 A1 * | 10/2004 | Saitoh | ............. | H04N 9/3105 349/5 |
| 2018/0164409 A1 * | 6/2018 | Chen | ............. | G01J 1/0271 |

* cited by examiner

*Primary Examiner* — Walter H Swanson
*Assistant Examiner* — Jacob T Nelson
(74) *Attorney, Agent, or Firm* — Michelle F. Murray; Frank D. Cimino

(57) ABSTRACT

An example apparatus includes: an integrated circuit including a first surface and terminals; a package including: a housing around the integrated circuit, the housing exposing the first surface; and an electrical interconnect including a second surface and an opening, the second surface electrically coupled to the terminals, the second surface mechanically coupled to the housing, the opening configured to expose the first surface.

20 Claims, 20 Drawing Sheets

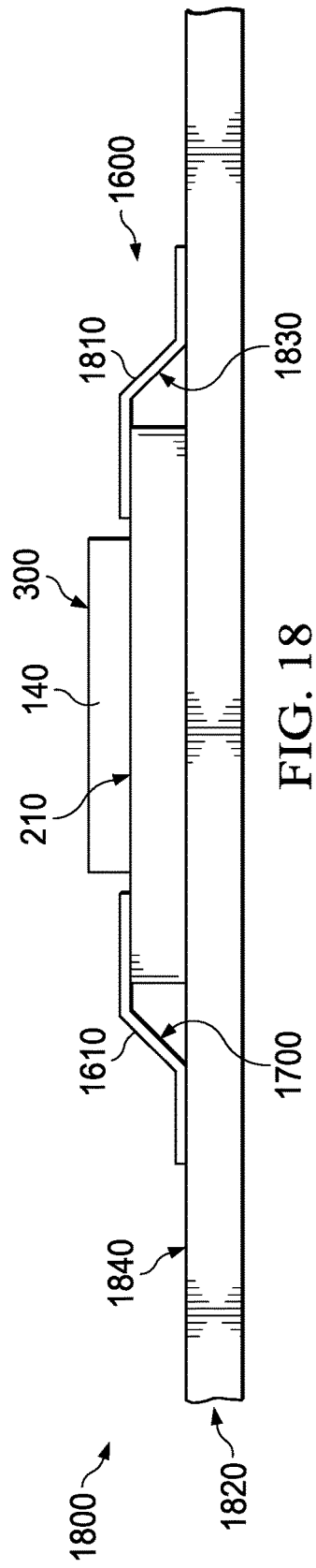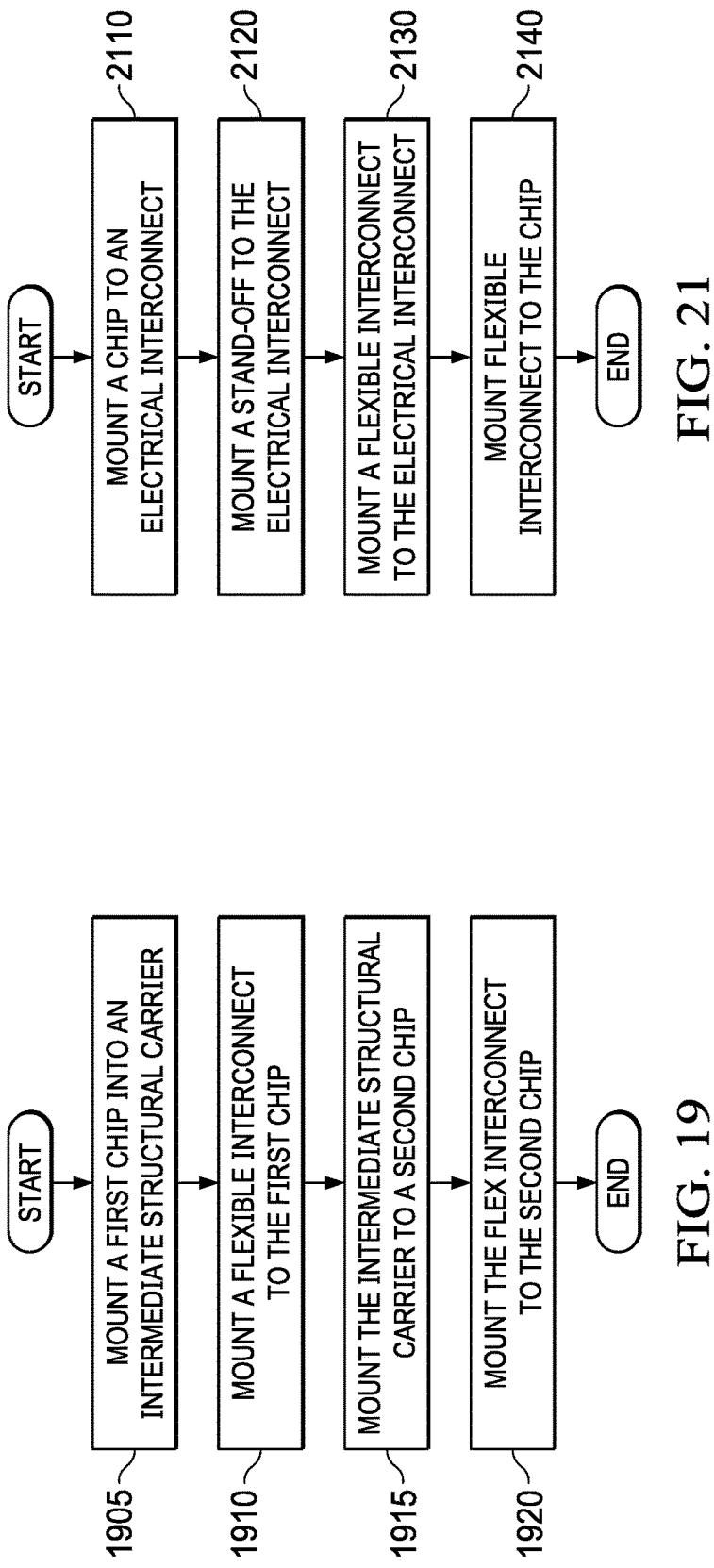

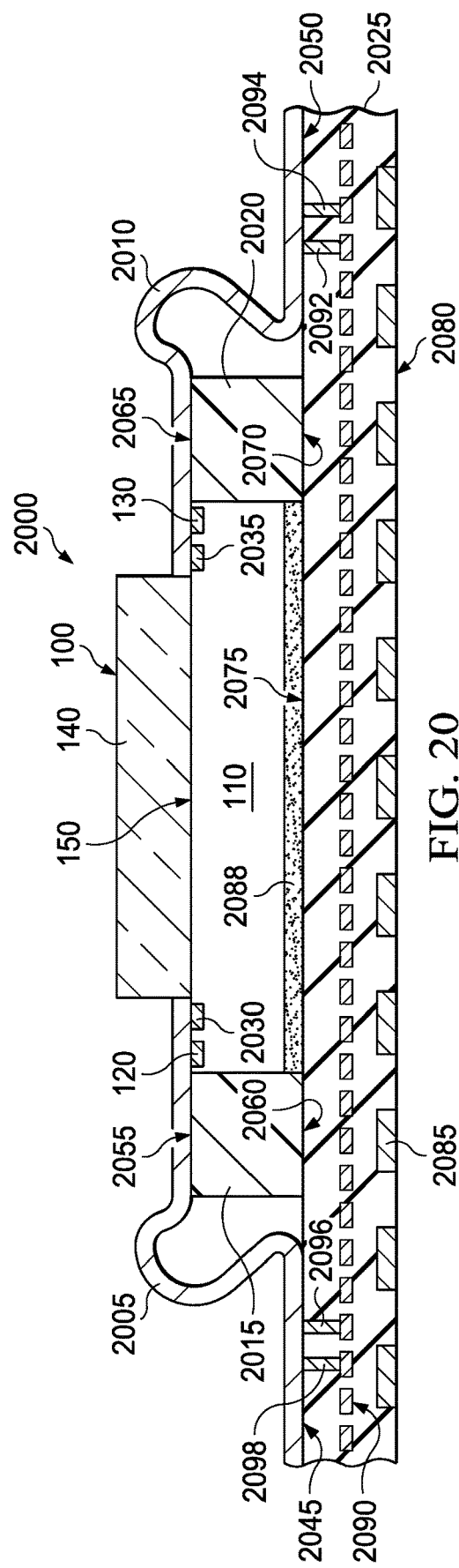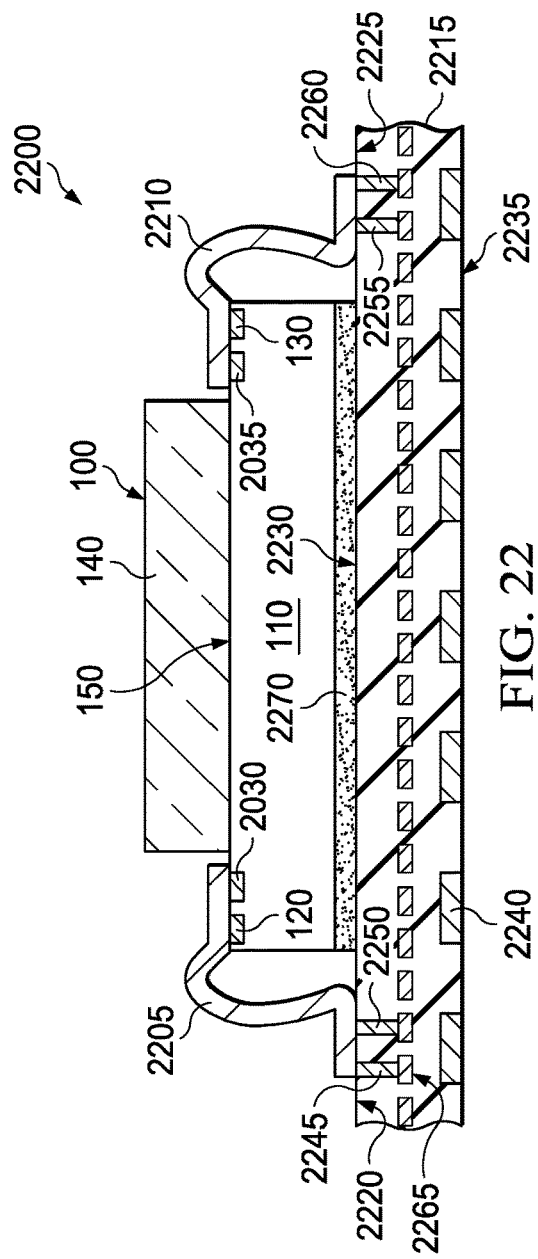

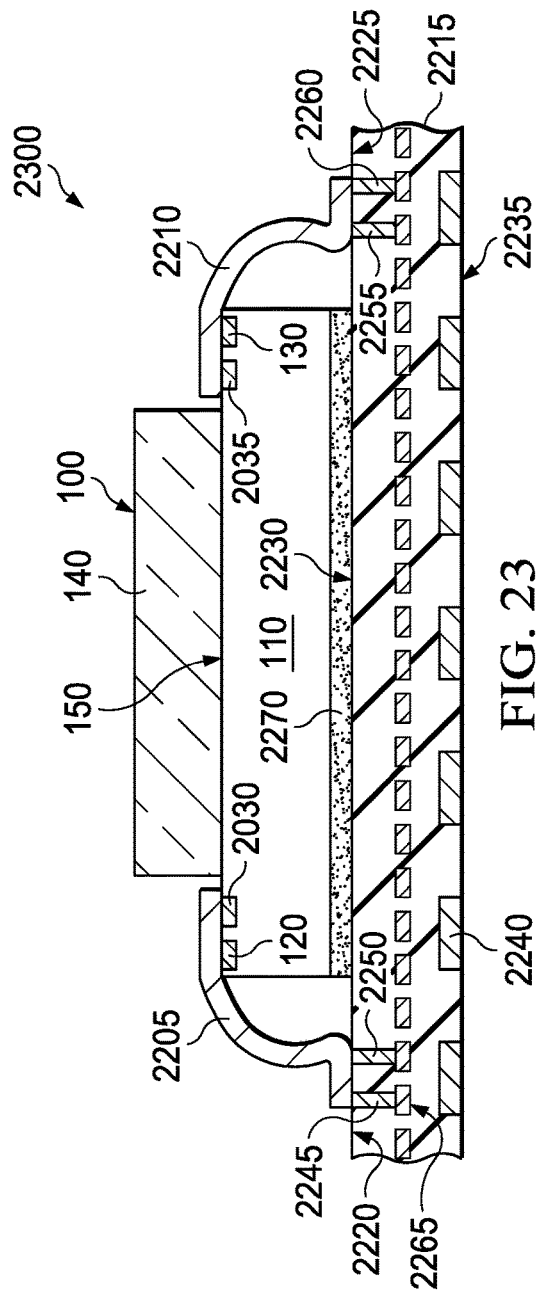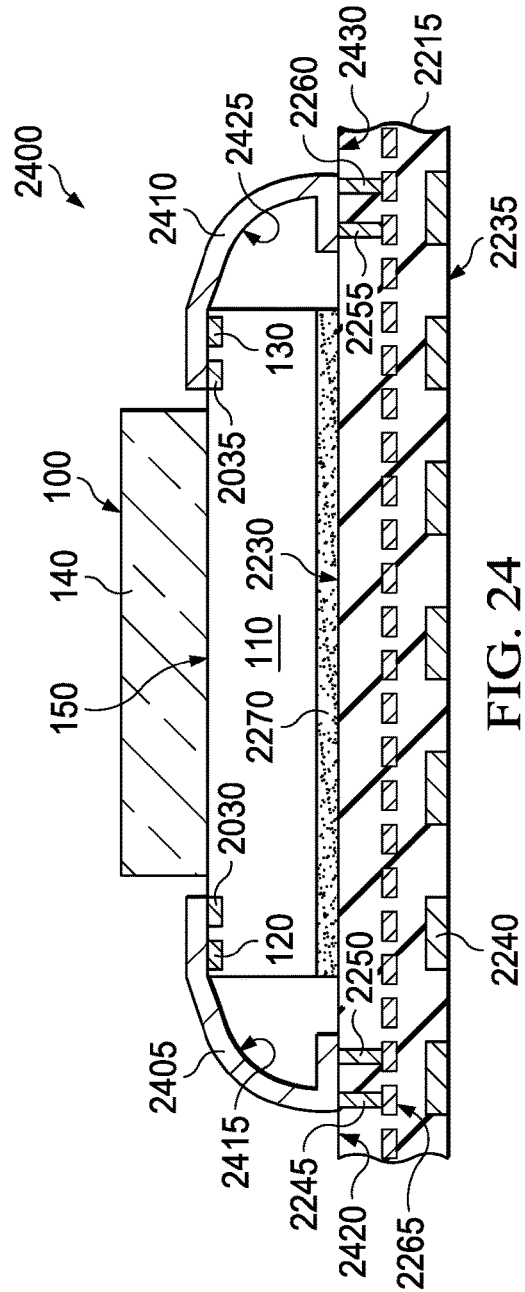

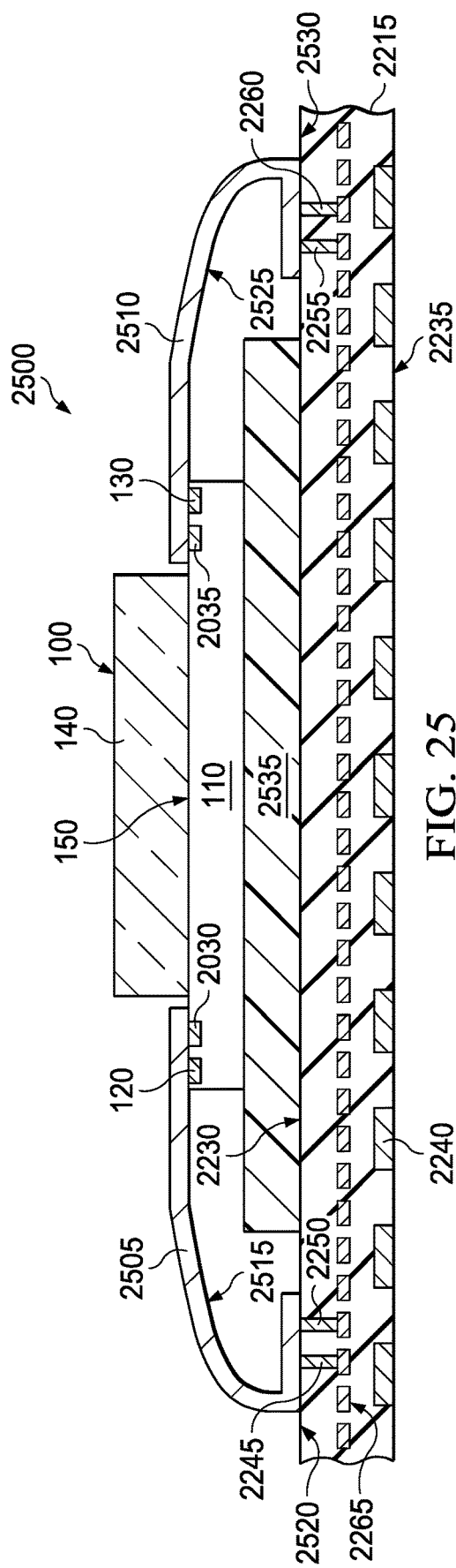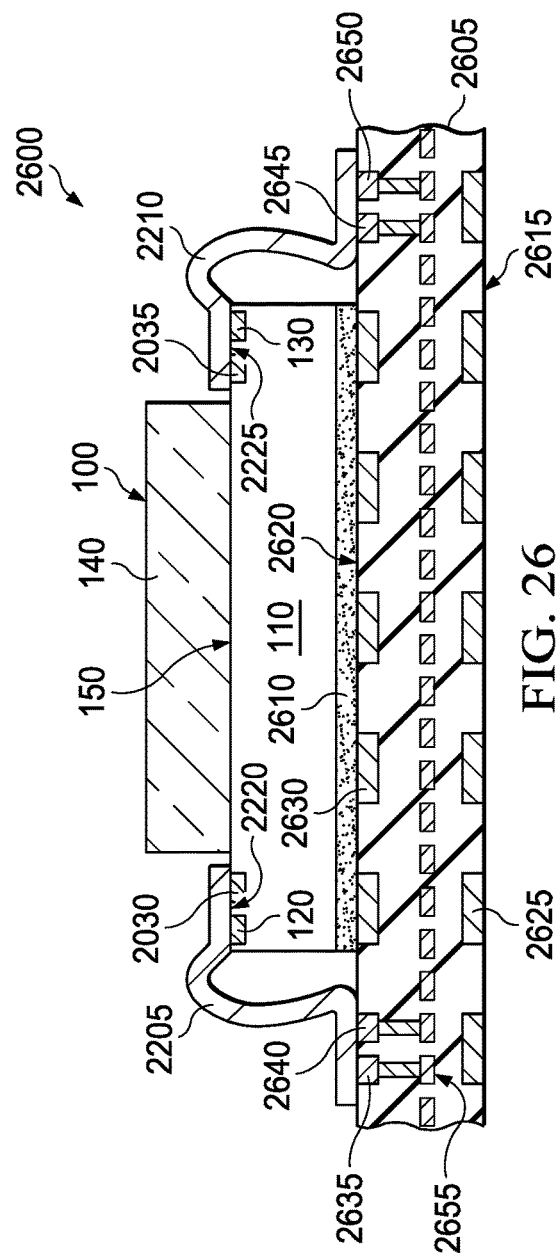

INTEGRATED CIRCUIT DEVICE PACKAGE

CROSS-REFERENCE TO RELATED APPLICATION

This patent application claims the benefit of and priority to U.S. Provisional Patent Application Ser. No. 63/087,944 filed Oct. 6, 2020, which application is hereby incorporated herein by reference in its entirety.

TECHNICAL FIELD

This description relates generally to integrated circuits, and more particularly to methods and apparatus for an integrated circuit device package.

BACKGROUND

Integrated circuits (ICs) may receive electrical inputs and generate electrical outputs. An optical IC may receive an electrical input and generate an optical output. In an example, optical ICs may receive an optical input and generate an electrical output. Thus, optical IC packages accommodate both an electrical interface (to support the electrical input and/or the electrical output) and an optical interface (to support the optical input and/or the optical output). An optical interface is a portion of the IC package designed to allow optical signals (e.g., light) to enter and/or exit the IC package. Conventionally, accommodating for the optical interface increases the optical IC package size due to mechanical alignment features needed to attach the optical IC to a printed circuit board (PCB).

SUMMARY

For methods and apparatus to package an integrated circuit device, an example apparatus includes an integrated circuit including a first surface and terminals; a package including: a housing around the integrated circuit, the housing exposing the first surface; and an electrical interconnect including a second surface and an opening, the second surface electrically coupled to the terminals, the second surface mechanically coupled to the housing, the opening configured to expose the first surface.

BRIEF DESCRIPTION OF THE DRAWINGS

FIG. 18 illustrates a side view of a fifth example assembly including the fourth assembly of FIGS. 16 and 17, and a fourth example electrical interconnect.

FIG. 19 is a flowchart representative of an example method to manufacture the fifth assembly of FIG. 18.

FIG. 20 illustrates a side view of a sixth example assembly including the first integrated circuit of FIG. 1, a plurality of electrical interconnects, and a plurality of stand-offs.

FIG. 21 is a flowchart representative of an example method to manufacture the sixth assembly of FIG. 20.

FIG. 22 is a side view of a seventh example assembly.

FIG. 23 is a side view of an eighth example assembly.

FIG. 24 is a side view of a ninth example assembly.

FIG. 25 is a side view of a tenth example assembly including a second housing.

FIG. 26 is a side view of an eleventh example assembly.

DETAILED DESCRIPTION

Figure 1:
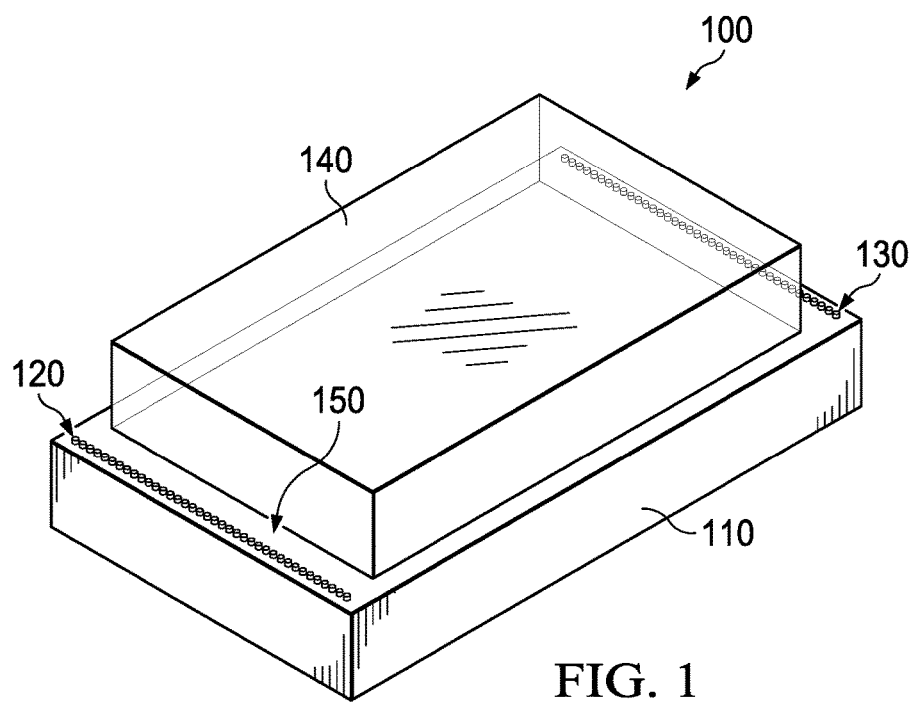
FIG. 1 illustrates an isometric view of a first example integrated circuit.

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

Electrical ICs may receive electrical inputs and generate electrical outputs. An optical IC may receive an electrical input and generate an optical output. In an example, optical ICs may receive an optical input and generate an electrical output. Example optical ICs may include spatial light modulators, digital micromirror devices, optical sensors, optical sources, an optical device, and optical processors, etc. An optical IC may be referred to as an optical device. For example, a digital micromirror device (DMD) is an optical IC that receives an electrical input, an optical input (e.g., light), and generates an optical output (e.g., an image). A DMD may be implemented to receive digital video data as an electrical input and generate an image as an optical output. The optical output of the DMD is based on the way the electrical interface controls the DMD to reflect light from the optical input, such that images may be displayed. In some such applications, the optical IC packaging includes an opening, such that the optical output may be viewed.

Optical IC packages accommodate both an electrical interface (to support the electrical input and/or the electrical output) and an optical interface (to support the optical input and/or the optical output). An optical interface is a portion of the IC package designed to allow optical signals (e.g., light) to enter and/or exit the IC. An electrical interface is a portion of the IC package designed to be electrically coupled to additional circuitry (e.g., a PCB, a processing circuit, a receiver, etc.). In some applications, such as the DMD, the electrical interface is designed to be electrically coupled to another integrated circuit in such a way that results in the optical interface being aligned, such that the optical input and/or output operate as designed. For example, a DMD may align the optical interface on the optical IC before aligning the electrical interface on the PCB.

Accommodating the optical interface typically increases the optical IC package size by including features to mechanically align the optical IC to a PCB. Some optical IC applications allow mechanical alignment features to be included on the PCB. Including the mechanical alignment features on the PCB allows for a smaller optical IC package. Some electrical IC applications allow the electrical IC die to attach directly to the PCB. Some optical ICs use wire bonding to electrically couple to a PCB.

The methods and apparatus to package an integrated circuit device described herein include an alignment method, such as a mechanical alignment method, for an electrical interface and/or an optical interface. The mechanical alignment method may be configured to mechanically align the electrical interface and optical interface of an optical IC. The mechanical alignment method implements an intermediate structural carrier (e.g., a housing) to align an electrical coupling of the optical IC and an external PCB. The intermediate structural carrier may be implemented to align the optical interface of the optical IC as a result of the electrical coupling. The intermediate structural carrier enables an electrical interconnect to easily and durably be mechanically and/or electrically coupled to the optical IC. The electrical interconnect enables the optical IC to easily and durably be electrically coupled to an IC. The intermediate structural carrier and electrical interconnect enable an optical IC to be durably electrically and/or mechanically coupled to an IC, such that both the optical interface and the electrical interface are aligned.

FIG. 1 illustrates an isometric view of a first example integrated circuit 100. As shown in the illustrated example, the first integrated circuit 100 includes an example optical IC 110. The optical IC 110 may be configured to include circuitry supporting electrical and optical, input and/or output. The optical IC 110 includes a first example plurality of terminals 120, a second plurality of terminals 130, an optical interface 140, and a surface 150. Additionally, the optical IC 110 may internally include circuitry (e.g., memory, processing logic, etc.) and mechanical components (e.g., micromirrors, light sources, etc.) to support the operation of the first integrated circuit 100. The plurality of terminals 120 and 130 form all or part of an electrical interface. In the example of FIG. 1, the first integrated circuit 100 is the optical IC 110 mechanically coupled to the optical interface 140, such that the optical interface 140 and the electrical interface (including the first plurality of terminals 120 and the second plurality of terminals 130) are included on the surface 150.

Figure 2:
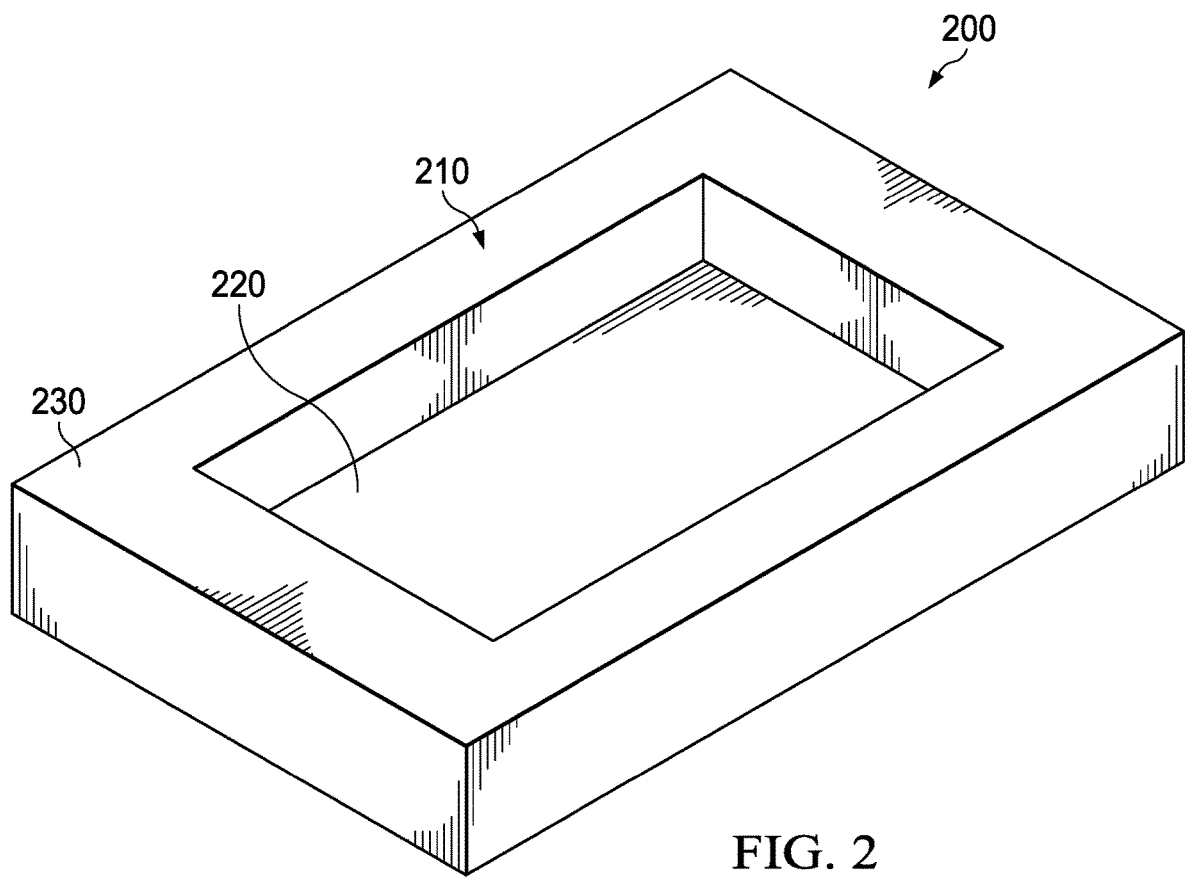
FIG. 2 illustrates an isometric view of a first example housing constructed in accordance with the teachings disclosed herein.

FIG. 2 illustrates an isometric view of a first example housing 200. As shown in the illustrated example, the first housing 200 includes a surface 210, a first example opening 220 and a first example edge 230. In the example of FIG. 2, the first opening 220 includes dimensions similar to (in some cases exactly the same as) the dimensions of the optical IC 110 of FIG. 1. The dimensions of the first edge 230 are based on the difference between the dimensions of the surface 210 and the dimensions of the first opening 220. The first edge 230 is configured to extend around the first opening 220 to the edge of the surface 210. Alternatively, the first edge 230 may be configured to extend around a portion of the first opening 220 or implemented with a plurality of edges. The first housing 200 may be manufactured using an electrical insulator, such as an epoxy material.

Figure 3:
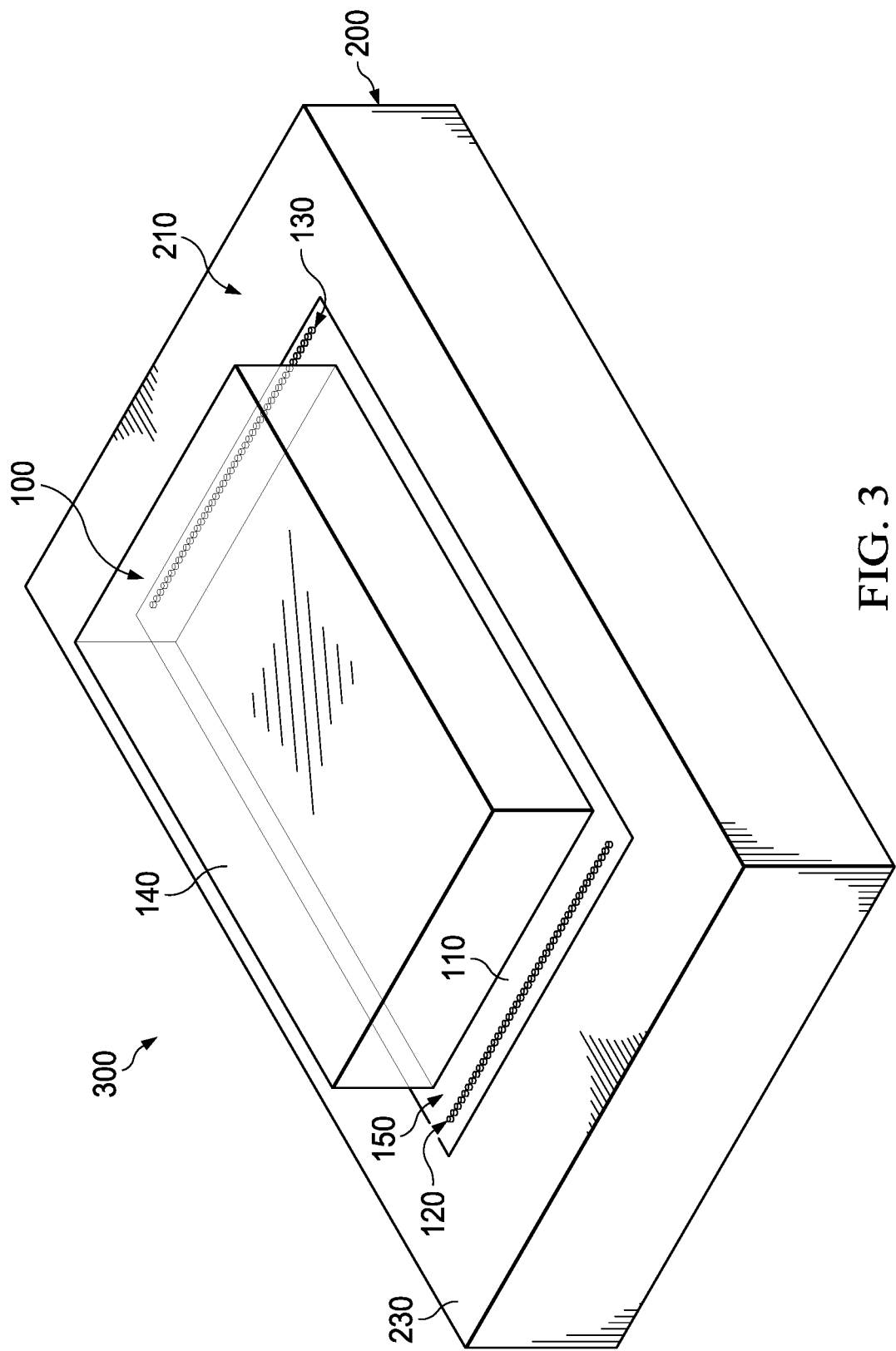
FIG. 3 illustrates an isometric view of a first example assembly including the first integrated circuit of FIG. 1 and the first housing of FIG. 2.

FIG. 3 illustrates an isometric view of a first example assembly 300 including the first integrated circuit 100 of FIG. 1 and the first housing 200 of FIG. 2. In the example of FIG. 3, the first integrated circuit 100 is shown inserted into the first opening 220 of the first housing 200, such that the surface 150 of the first integrated circuit 100 is aligned (e.g., substantially flush) with the surface 210 of the first housing 200. The first plurality of terminals 120 and the second plurality of terminals 130 are configured to protrude out of the surface 150 of the first integrated circuit 100. Alternatively, the terminals may be flush with the surface 150 of the first integrated circuit 100. Advantageously, the first edge 230 is configured increase the surface size of the surface 150, such that the potential contact area during manufacturing is greater.

Figure 4:
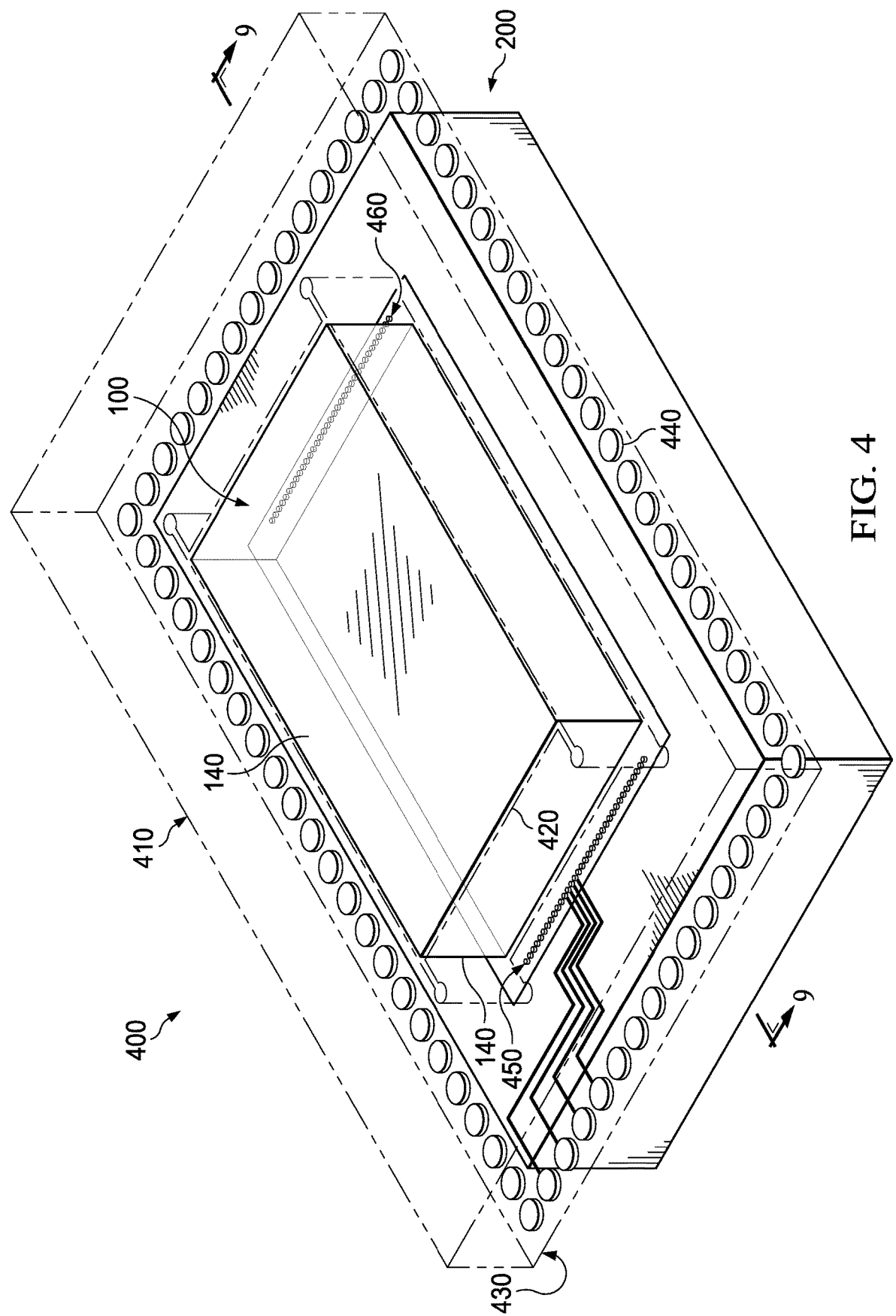
FIG. 4 illustrates a first isometric view of a second example assembly including the first assembly of FIG. 3 and a first example electrical interconnect.

FIG. 4 illustrates a first isometric view of a second example assembly 400 including the first assembly 300 of FIG. 3 and a first example electrical interconnect 410. The second assembly 400 includes the first integrated circuit 100 of FIGS. 1 and 3, the first housing 200 of FIGS. 2 and 3, and the first electrical interconnect 410. The first electrical interconnect may be manufactured as a printed circuit board (PCB) including a single semiconductor die or on multiple die. Alternatively, the first electrical interconnect 410 may be manufactured out of any suitable conductive material (e.g., copper, nickel, silver, gold, etc.) and insulator, designed to electrically couple a plurality of terminals to another plurality of terminals. In the example of FIG. 4, the first electrical interconnect 410 includes a second example opening 420, an example surface 430, and a third example plurality of terminals 440, a fourth example plurality of terminals 450, and a fifth example plurality of terminals 460. The second opening 420 is sized to enable the optical interface 140 of the first integrated circuit 100 to be exposed. The second opening 420 may additionally be configured to include additional space that may be used as a mechanical guide for coupling the first electrical interconnect 410 to the first assembly 300 of FIG. 3.

In the example of FIG. 4, the surface 430 includes the third plurality of terminals 440, the fourth plurality of terminals 450, and the fifth plurality of terminals 460. The third plurality of terminals 440 are configured to protrude from the surface 430 of the first electrical interconnect. Alternatively, the third plurality of terminals 440 may be flush with the surface 430. The fourth plurality of terminals 450 and fifth plurality of terminals 460 may be electrically coupled to the third plurality of terminals 440 through conductors routed through the first electrical interconnect 410. For example, the plurality of terminals 450 and 460 may be configured to be electrically coupled to the third plurality of terminals 440, such that each terminal in the third plurality of terminals corresponds to a terminal in the plurality of terminals 450 and 460. The fourth plurality of terminals 450 may be electrically coupled to the first plurality of terminals 120 of FIG. 1. The fifth plurality of terminals 460 may be electrically coupled to the second plurality of terminals 130 of FIG. 1. In the example of FIG. 4, the surface 150 of the first integrated circuit 100 and the surface 210 of the first housing 200 (not pictured in FIG. 4 for clarity) are configured to be mechanically coupled to the surface 430 of the first electrical interconnect 410, such that the first electrical interconnect 410 covers the surface 210 of the first housing 200. Alternatively, the first electrical interconnect 410 may be configured to cover a portion of the surface 210 of the first housing 200.

Figure 5:
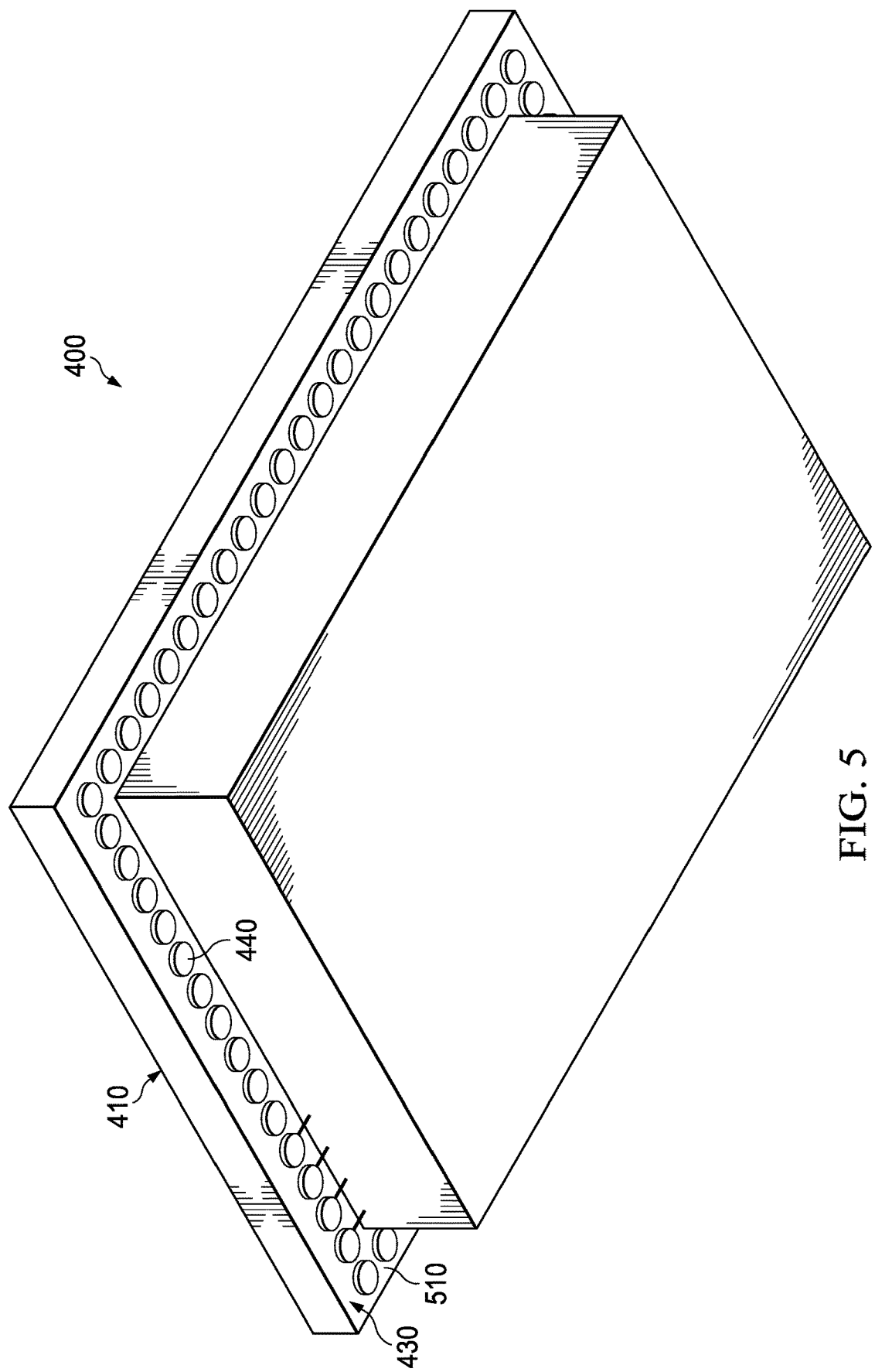
FIG. 5 illustrates a second isometric view of the second example assembly of FIG. 4.

FIG. 5 illustrates a second isometric view of the second assembly 400 of FIG. 4 including the first assembly 300 of FIG. 3 and the first electrical interconnect 410 of FIG. 4. In the example of FIG. 5, the surface 430 of the first electrical interconnect 410 includes the third plurality of terminals 440 and a second example edge 510. The second edge 510 is configured to be the result of the mechanical alignment of the first housing 200, such that the surface 210 may be mechanically coupled to the surface 430 to determine the dimensions of the second edge 510. The dimensions of the second edge 510 are based on the difference between the dimensions of the second opening 420 and the dimensions of the surface 430 of the first electrical interconnect 410. The second edge 510 is configured to extend around the surface 210 of the first housing 200 to the edge of the surface 430 of the first electrical interconnect 410. The second edge 510 is configured to include the third plurality of terminals 440, such that the third plurality of terminals 440 may protrude out of the surface 430 of the first electrical interconnect 410. Alternatively, the third plurality of terminals 440 may be flush with the surface 430 of the first electrical interconnect 410.

Figure 6:
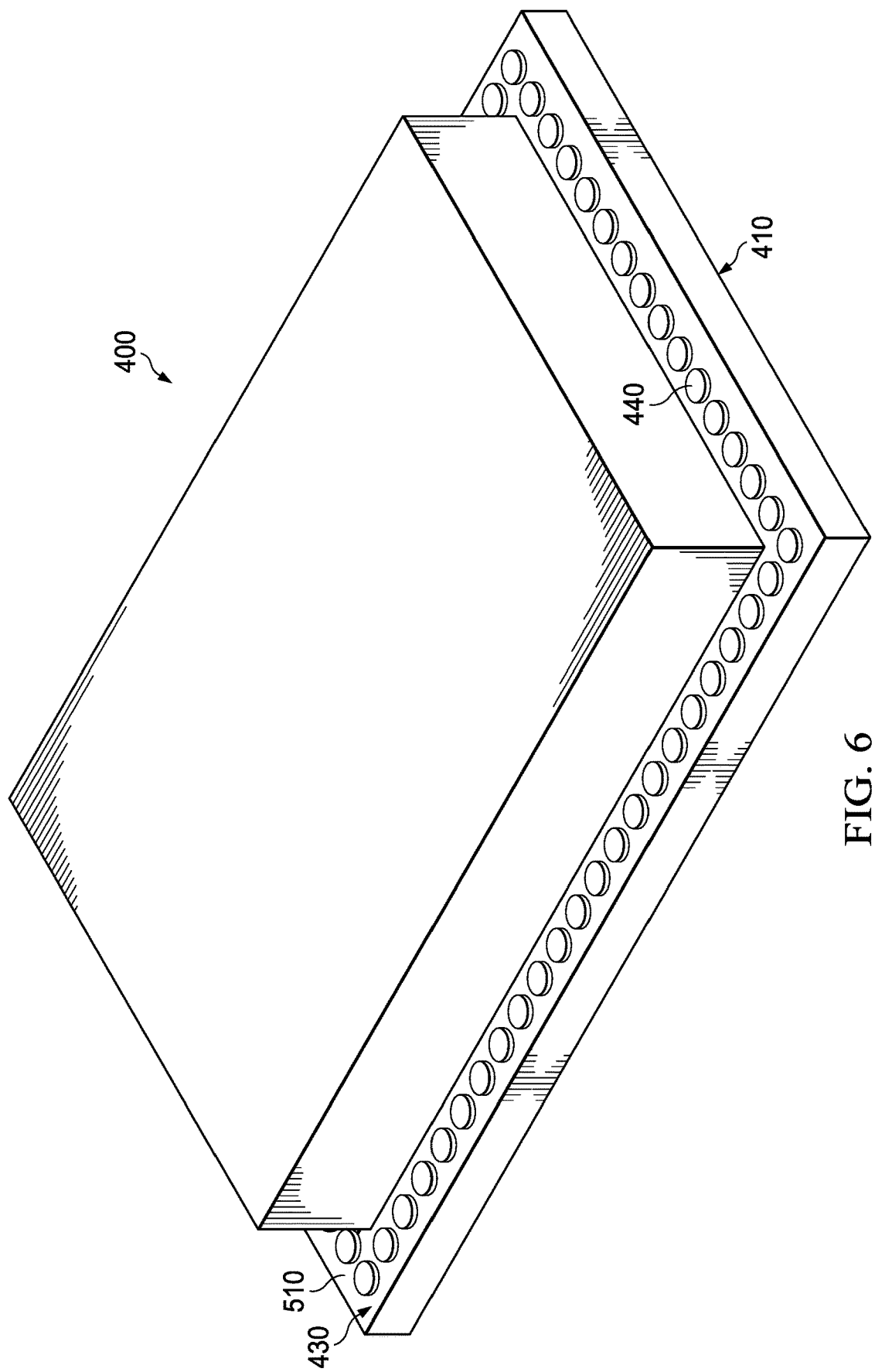
FIG. 6 illustrates a third isometric view of the second example assembly of FIG. 4.

FIG. 6 illustrates a third isometric view of the second example assembly 400 of FIGS. 4 and 5. As shown in the illustrated example, the third plurality of terminals 440 may be configured to extend around the second edge 510. Alternatively, the third plurality of terminals 440 may be configured to extend around a portion of the second edge 510.

Figure 7:
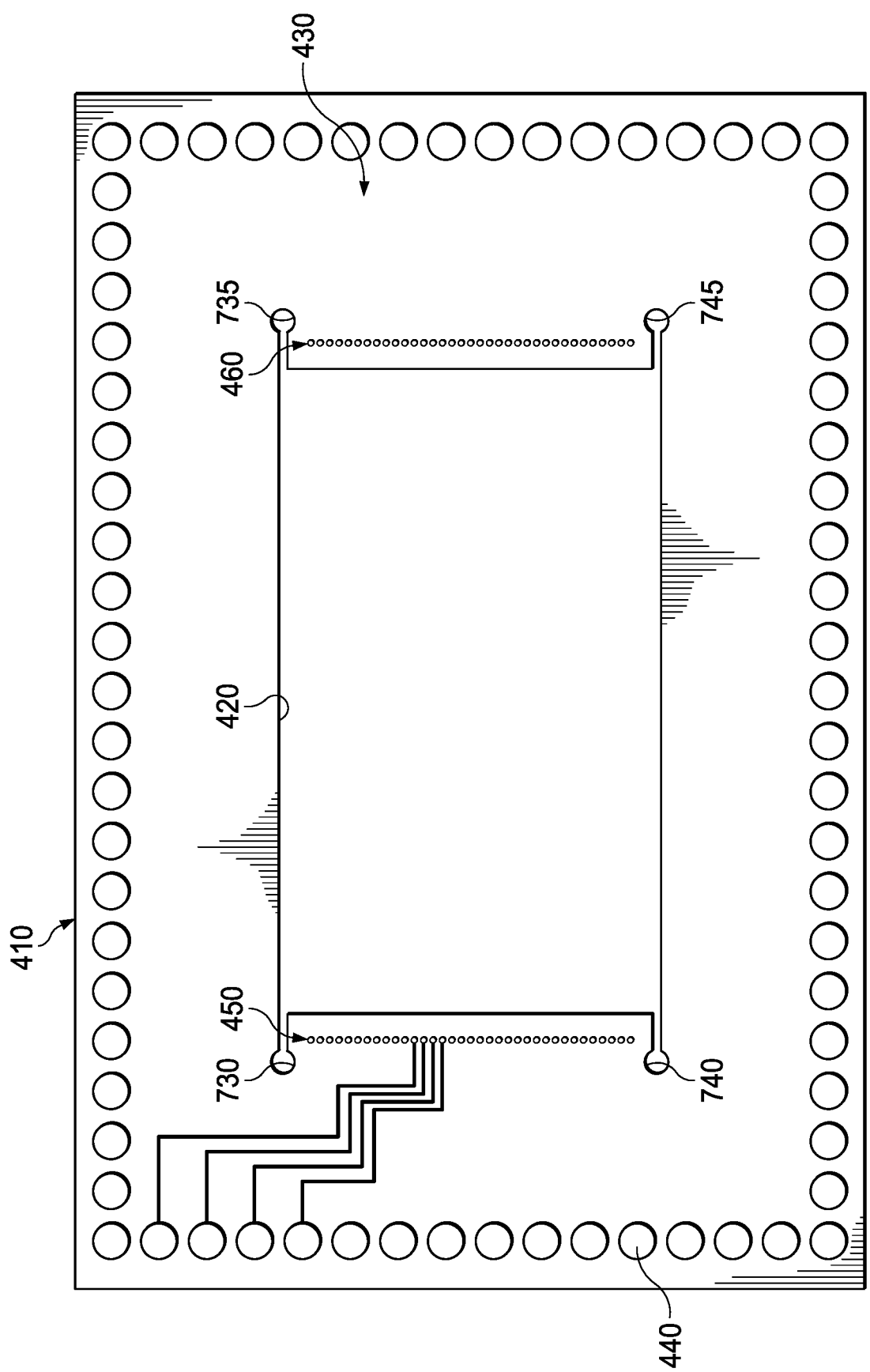
FIG. 7 illustrates a bottom view of the first electrical interconnect of FIGS. 4-6.

FIG. 7 illustrates a bottom view of the first electrical interconnect 410 of FIGS. 4 and 5. As shown in the illustrated example, the first electrical interconnect 410 includes the second opening 420, the surface 430, the third plurality of terminals 440, the fourth plurality of terminals 450, the fifth plurality of terminals 460, and example mechanical guides 730-745. In the example of FIG. 7, the third plurality of terminals 440 are exposed when the surfaces 150 and 210 are mechanically coupled to the surface 430. Alternatively, the first electrical interconnect 410 may include one or more terminals configured to couple to one or more terminals of the first integrated circuit 100 of FIG. 1. In the example of FIG. 7, the second opening 420 includes the mechanical guides 730-745. The mechanical guides 730-745 are configured to mechanically align the first electrical interconnect 410 to the first assembly 300 of FIG. 3, such that the optical interface and electrical interface are aligned during the manufacturing process. Alternatively, the mechanical guides 730-745 may be configured to be included in the second opening 420, such that the mechanical guides may mechanically align the first electrical interconnect 410 to an integrated circuit (e.g., the first integrated circuit 100 of FIG. 1).

Figure 8:
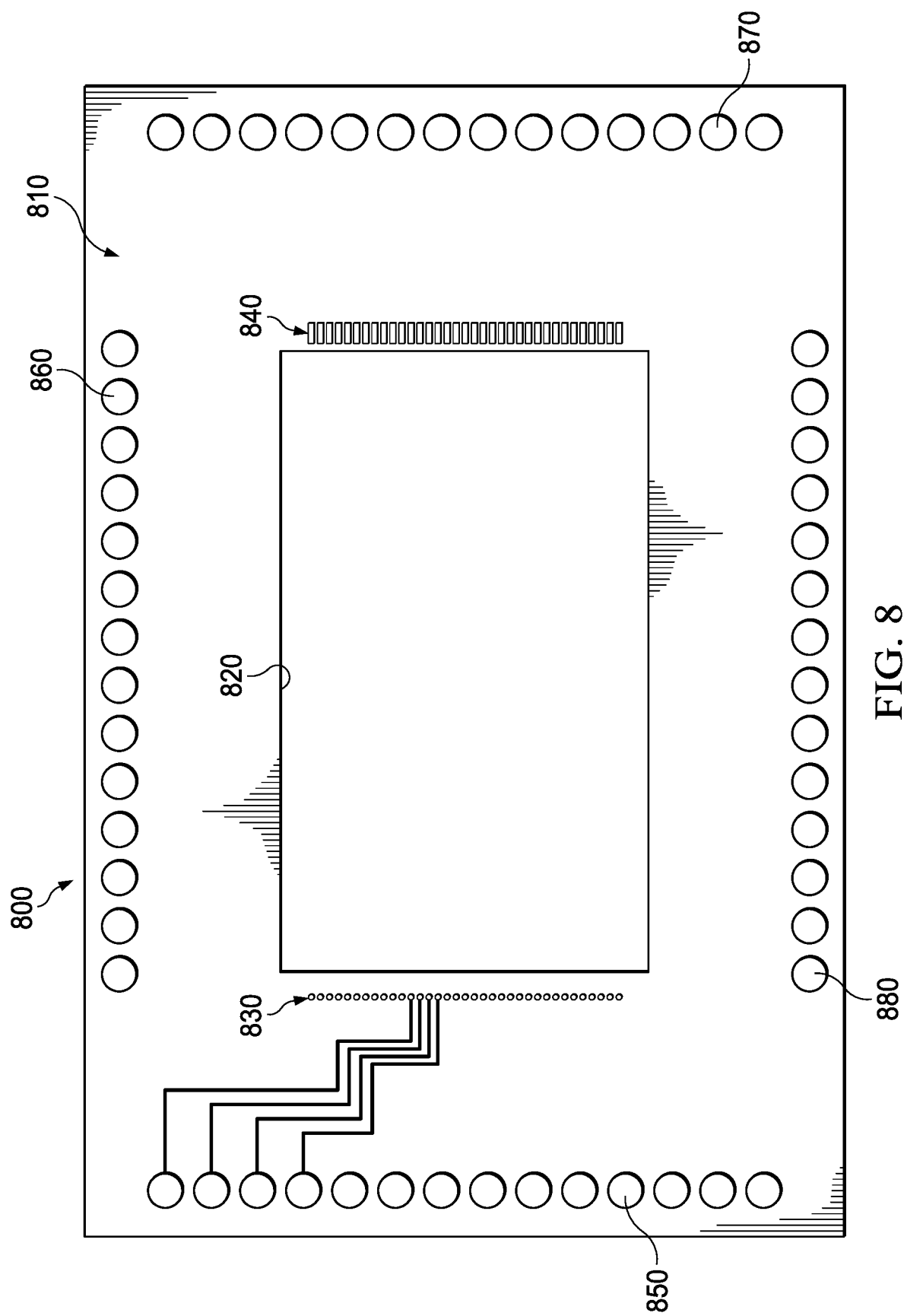
FIG. 8 illustrates a bottom view of a second example electrical interconnect.

FIG. 8 illustrates a bottom view of a second example electrical interconnect 800. As shown in the illustrated example, the second electrical interconnect 800 includes an example surface 810, a third example opening 820, a sixth example plurality of terminals 830, a seventh plurality of terminals 840, an eighth example plurality of terminals 850, a ninth example plurality of terminals 860, a tenth example plurality of terminals 870, and an eleventh plurality of terminals 880. The first electrical interconnect 410 of FIGS. 4-6 may be the first electrical interconnect 700 or the second electrical interconnect 800.

In the example of FIG. 8, the surface 810 of the second electrical interconnect 800 includes the third opening 820, such that the optical interface of the first integrated circuit 100 may be aligned. Alternatively, the third opening 820 may be configured based on the optical and/or electrical interface of the integrated circuit (e.g., the first integrated circuit 100) being packaged. The plurality of terminals 850-780 are electrically coupled to the sixth plurality of terminals 830 and/or the seventh plurality of terminals 840. The sixth plurality of terminals 830 are configured to be electrically coupled to the first plurality of terminals 120. The seventh plurality of terminals 840 are electrically coupled to the second plurality of terminals 130. Alternatively, the second electrical interconnect 800 may include one or more terminals configured to be electrically coupled to one or more terminals of the first integrated circuit 100.

Figure 9:
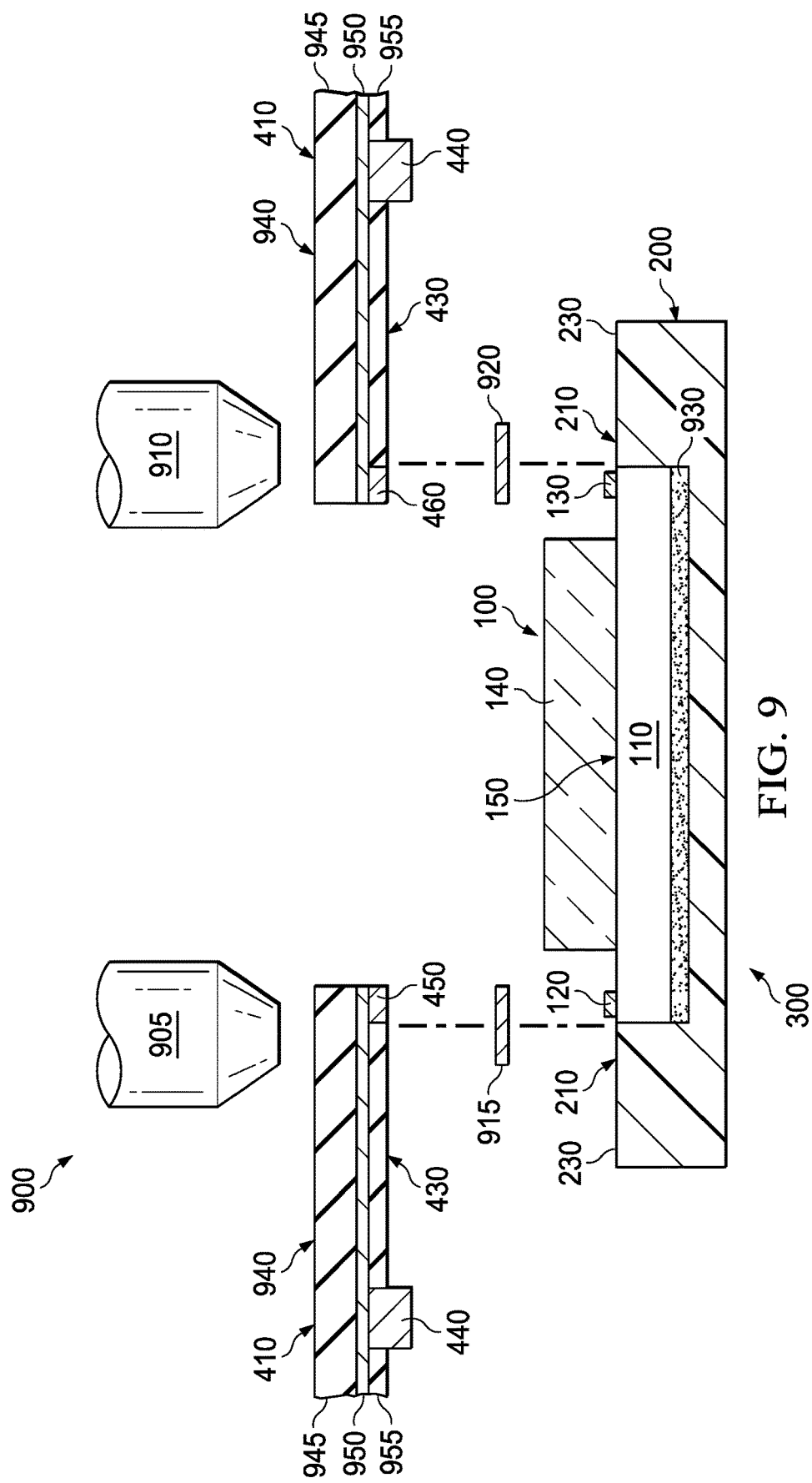
FIG. 9 illustrates a cross-sectional view of an example apparatus to assemble the second assembly of FIG. 4.

FIG. 9 illustrates a cross-sectional view of an example assembly apparatus 900 to assemble the second assembly 400 of FIGS. 4-6. The assembly apparatus 900 is configured to illustrate the method implemented to electrically couple the first electrical interconnect 410 to the first assembly 300 of FIG. 3. As shown in the illustrated example, the assembly apparatus 900 includes the first assembly 300, the first electrical interconnect 410, a first example heat source 905, a second example heat source 910, a first example conductive film 915, a second conductive film 920, and a first example adhesive 930. The conductive films 915 and 920 may be an anisotropic conductive film (e.g., solder paste, conductive adhesive, low temperature silver epoxy, etc.).

As shown in the illustrated example, the first integrated circuit 100 is mechanically coupled to the first housing 200 by the first adhesive 930, such that the surface 150 of the first integrated circuit 100 is aligned with the surface 210 of the first housing 200. The first conductive film 915 is configured to be electrically coupled to the first plurality of terminals 120 and to the fourth plurality of terminals 450. The second conductive film 920 is configured to be electrically coupled to the second plurality of terminals 130 and to the fifth plurality of terminals 460. The conductive films 915 and 920 may be assembled to be electrically coupled, such that the surface 150 of the first integrated circuit 100 is electrically coupled to the surface 430 of the first electrical interconnect 410. The conductive films 915 and 920 (e.g., solder paste, conductive adhesive, low temperature silver epoxy, etc.) may be configured to be mechanically coupled to the surfaces 210 and 430, such that the surface 210 of the first housing 200 of FIG. 2 is mechanically coupled to the surface 430 of the first electrical interconnect 410. Advantageously, the conductive films 915 and 920 enable the assembly of the second assembly 400 of FIG. 4 to be performed by applying heat to the components.

As shown in the illustrated example, the first heat source 905 is configured to apply sufficient heat to an example surface 940, such that the surfaces 150 and/or 210 are mechanically coupled to the surface 430 of the first electrical interconnect 410 by the first conductive film 915. The amount of heat applied to the surface 940 is based on the material the conductive films 915 and 920 are manufactured from and/or limited by the amount of heat that may be applied to the first integrated circuit 100. The second heat source 910 is configured to apply sufficient heat to the surface 940 of the first electrical interconnect 410, such that the surfaces 150 and/or 210 are mechanically coupled to the surface 430 of the first electrical interconnect 410 by the second conductive film 920. In the example of FIG. 9, the heat sources 905 and 910 are configured to supply heat to an area on the surface 940 greater than the area of the plurality of terminals 120 and 130. The first edge 230 is configured to enable the area of the heat source 905 and 910 to be greater, such that the pressure applied to the surface 940 may not damage the components. Advantageously, the first edge 230 enables simpler manufacturing of the second assembly 400 of FIG. 4 by enabling greater contact area of the heat source 905 and 910 with the surface 940.

As shown in the illustrated example, the first electrical interconnect 410 is comprised of a first example layer 945, a second example layer 950 and a third layer 955. The first layer 945 is configured separate the heat sources 905 and 910 from the second layer 950. The first layer 945 may be manufactured as an example insulator. The second layer 950 is manufactured as a conductor that may be electrically coupled to the plurality of terminals 440, 450, and/or 460. Alternatively, portions of the second layer 950 may be separated by an insulating material, such that the second layer 950 may be comprised of a plurality of conductive traces to individually be electrically coupled a terminal from the plurality of terminals 440, 450, and/or 460 to another terminal from the plurality of terminals 440, 450, and/or 460. The third layer 955 is manufactured as an example insulator including portions of conductive terminals to be electrically coupled to portions of the second layer 950. Alternatively, the first electrical interconnect 410 may be any electrical interconnect (e.g., the second electrical interconnect 800 of FIG. 8).

Figure 10:
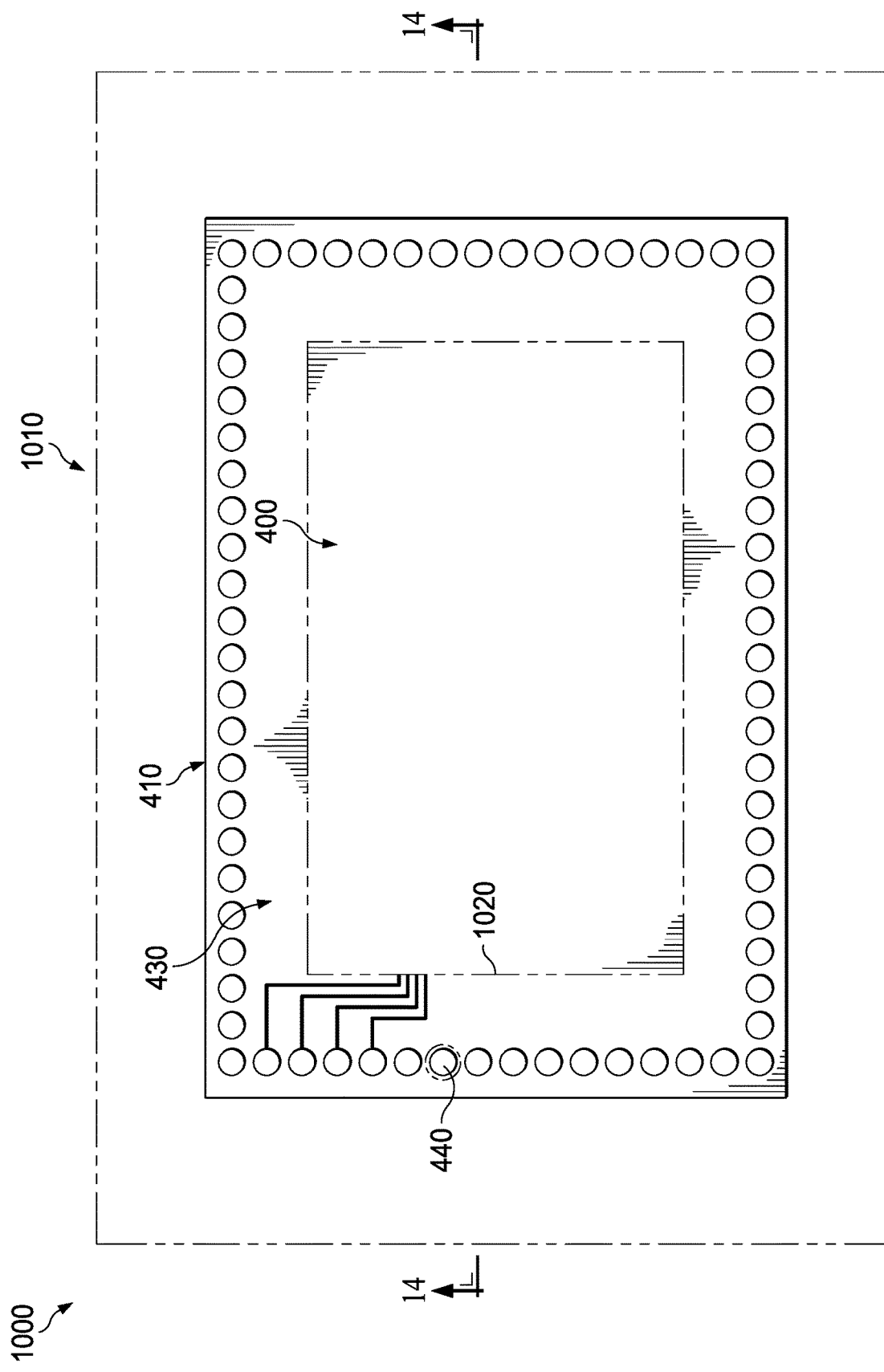
FIG. 10 illustrates a bottom view of a third example assembly including the second assembly of FIG. 4 and a second example integrated circuit.

FIG. 10 illustrates a bottom view of a third assembly 1000 including the second assembly 400 of FIG. 4 and a second example integrated circuit 1010. The second integrated circuit 1010 includes a fourth example opening 1020. The second integrated circuit 1010 may be configured to include processing circuitry, memory, and/or additional circuitry to be electrically coupled to the first integrated circuit 100 of FIG. 1 through the third plurality of terminals 440. Alternatively, the second integrated circuit 1010 may be a motherboard or PCB. The fourth opening 1020 is configured to fit the first housing 200 of FIG. 2, such that the fourth opening 1020 may be around the first assembly 300 of FIG. 3, with the first electrical interconnect 410 of FIG. 4 electrically coupled to the second integrated circuit 1010. The surface 430 of the first electrical interconnect 410 extends above the top surface of the second integrated circuit 1010, such that the third plurality of terminals 440 may be electrically coupled to the second integrated circuit 1010. The third plurality of terminals 440 may be electrically coupled to the second integrated circuit 1010 using the method described in FIG. 9.

Figure 11:
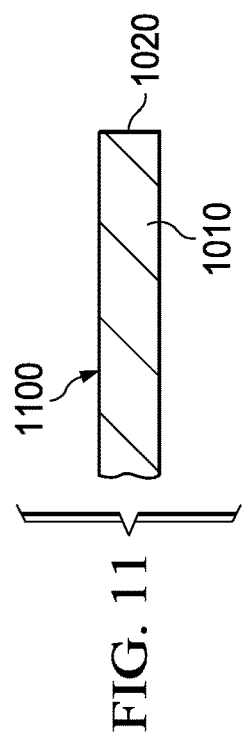
FIG. 11 illustrates a first cross-sectional view of the second integrated circuit of FIG. 10 along line 14-14 of FIG. 10.

FIG. 11 illustrates a cross-sectional view of the second integrated circuit 1010 of FIG. 10 along line 14-14. As shown in the illustrated example, the second integrated circuit 1010 includes the fourth opening 1020 and a surface 1100. The fourth opening 1020 is manufactured to house the first housing 200 of FIG. 2. The surface 1100 of the second integrated circuit 1010 may include a plurality of terminals to be electrically coupled to additional circuitry (e.g., an optical IC, a processor, a sensor, etc.).

Figure 12:
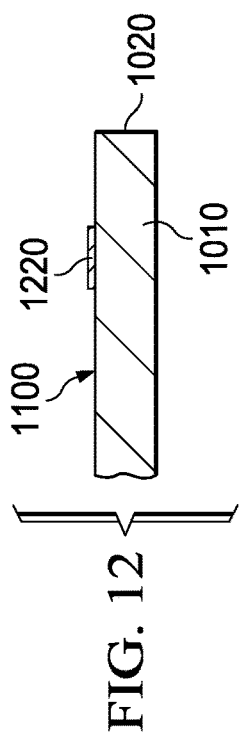
FIG. 12 illustrates a second cross-sectional view of the second integrated circuit of FIG. 10 along line 14-14 of FIG. 10 including an example adhesive.

FIG. 12 illustrates a second cross-sectional view of the second integrated circuit 1010 of FIG. 10 along line 14-14 including an example adhesive. As shown in the illustrated example, the second integrated circuit 1010 includes the fourth opening 1020, the surface 1100, a third example conductive film 1210, and a fourth example conductive film 1220. The conductive films 1210 and 1220 (e.g., solder paste, conductive adhesive, low temperature silver epoxy, etc.) may be electrically coupled to a plurality of terminals on the surface 1100 of the second integrated circuit 1010.

Figure 13:
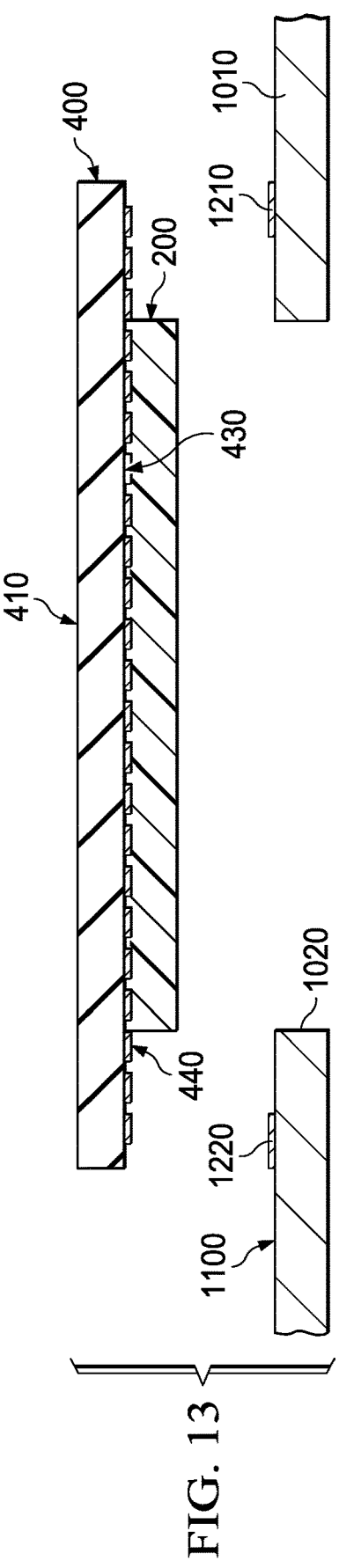
FIG. 13 illustrates a third cross-sectional view of the third assembly of FIG. 10 along line 14-14 of FIG. 10.

FIG. 13 illustrates a cross-sectional view of the third assembly 1000 of FIG. 10 along line 14-14. As shown in the illustrated example, the second assembly 400 is mechanically aligned, such that the first housing 200 may be housed in the fourth opening 1020. Advantageously, the mechanical alignment of the first housing 200 is configured to mechanically align the third plurality of terminals 440, such that the third plurality of terminals may be electrically coupled to the conductive films 1210 and 1220.

Figure 14:
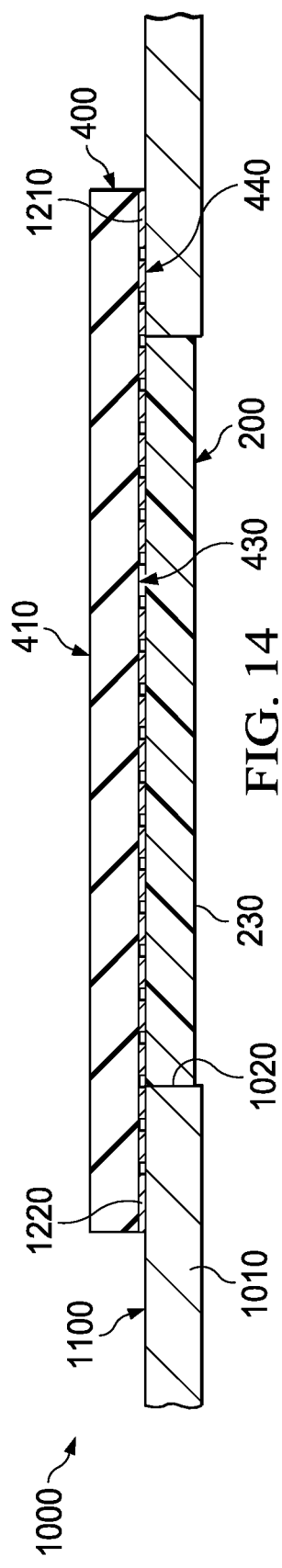
FIG. 14 illustrates a fourth cross-sectional view of the third assembly of FIG. 10 taken along line 14-14 of FIG. 10.

FIG. 14 illustrates a cross-sectional view taken along line 10-10 of FIG. 10. As shown in the illustrated example, the third assembly 1000 including the second assembly 400 of FIG. 4, the second integrated circuit 1010, and the surface 1100. In the example of FIG. 14, the first housing 200 is surrounded by the fourth opening 1020, such that the surfaces 150 and 210 of the first assembly 300 of FIG. 3 are aligned with the surface 1100 of the second integrated circuit 1010. The surface 430 of the first electrical interconnect 410 is mechanically coupled to the surface 1100 of the second integrated circuit 1010. The third plurality of terminals 440 may be electrically coupled to a plurality of terminals on the surface 1100. The plurality of terminals on the surface 1100 may be configured to be electrically coupled to the conductive films 1210 and 1220. The plurality of terminals on the surface 1100 may be configured to be electrically coupled to a portion of the third plurality of terminals 440. Advantageously, the fourth opening 1020 enables the second assembly 400 of FIG. 4 to be mounted within the second integrated circuit 1010 minimizing the additional area added by the second assembly 400 of FIG. 4.

Figure 15:
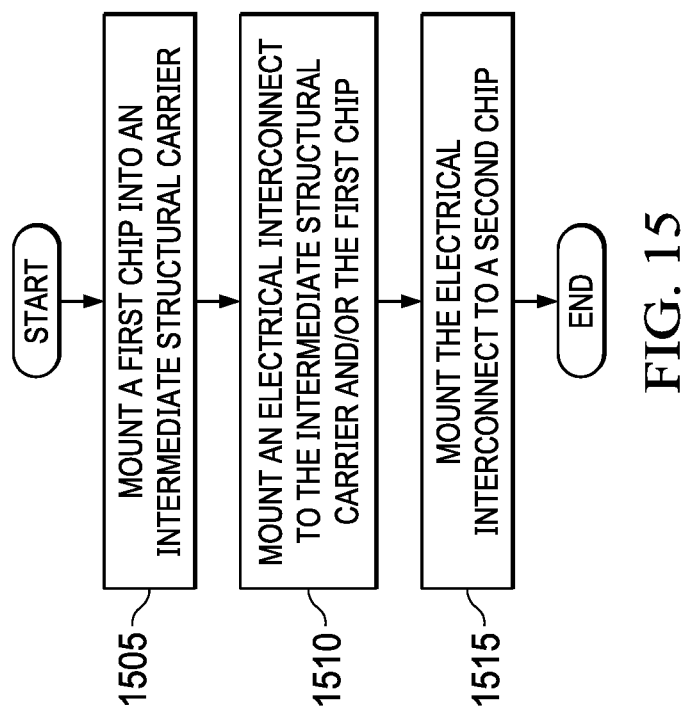
FIG. 15 is a flowchart representative of an example method to manufacture the third assembly of FIG. 10.

FIG. 15 is a flowchart representative of an example method to manufacture the third assembly of FIGS. 9 and 10. The example method is adapted to manufacture any type of integrated circuit packaging including a first integrated circuit (e.g., the first integrated circuit 100 of FIG. 1), an intermediate housing (e.g., the first housing 200 of FIG. 2), and an electrical interconnect (e.g., the first electrical interconnect 410 of FIG. 4, the second electrical interconnect 800 of FIG. 8, etc.) to a second integrated circuit (e.g., the second integrated circuit 1010 of FIG. 10).

In the example of FIG. 15, the process begins at block 1505 with mounting a first chip into an intermediate structural carrier. For example, mounting the first integrated circuit 100 of FIG. 1 into the first housing 200 of FIG. 2 to assemble the first assembly 300 of FIG. 3. In some methods of manufacturing a layer of adhesive may be added between the first integrated circuit 100 and the first housing 200. Alternatively, the first integrated circuit 100 and the first housing 200 may be manufactured such that no adhesive is required, such that the first integrated circuit 100 is housed by the first housing 200. At block 1505, the first integrated circuit 100 is mechanically coupled to the first housing 200. The process proceeds to block 1510.

In the example of FIG. 15, at block 1510, an electrical interconnect is mounted to the intermediate structural carrier and/or to the first chip. For example, the first electrical interconnect 410 of FIGS. 4-6 is electrically coupled to the first integrated circuit 100, as illustrated in the assembly apparatus 900 of FIG. 9. The process of block 1510 may include the assembly apparatus 900 of FIG. 9. The process of block 1510 may include the heat sources 905 and 910 of FIG. 9, such the heat sources 905 and 910 of FIG. 9 may heat the first electrical interconnect 410 of FIG. 4 to electrically couple the plurality of terminals 120 and 130 of FIG. 1 to the plurality of terminals 450 and 460 of FIG. 4. The process of block 1510 is configured to supply enough heat to the first electrical interconnect 410 of FIG. 4, such that the conductive films 915 and 920 form electrical bonds without providing sufficient heat to damage the first integrated circuit 100 of FIG. 1. The process described in block 1510 is illustrated by the assembly apparatus 900. Alternatively, the electrical interconnect may be mechanically coupled to the intermediate structural carrier by a layer of adhesive. The process proceeds to block 1515.

In the example of FIG. 15, at block 1515 the electrical interconnect is mounted to a second chip. The assembly from block 1510 is mounted to the second chip, such that a plurality of terminals on the electrical interconnect may be electrically coupled to a corresponding plurality of terminals on the second chip. Block 1515 may result in the third assembly 1000 of FIG. 10. Thereafter, the example method of FIG. 15 ends.

Although an example method is described with reference to the flowchart illustrated in FIG. 15, many other methods of manufacturing the example third assembly 1000 of FIGS. 9 and 10. For example, the order of execution of the blocks may be changed, and/or some of the blocks described may be changed, eliminated, or combined. Similarly, additional operations may be included in the manufacturing process before, in between, or after the blocks shown in the illustrated example.

Figure 16:
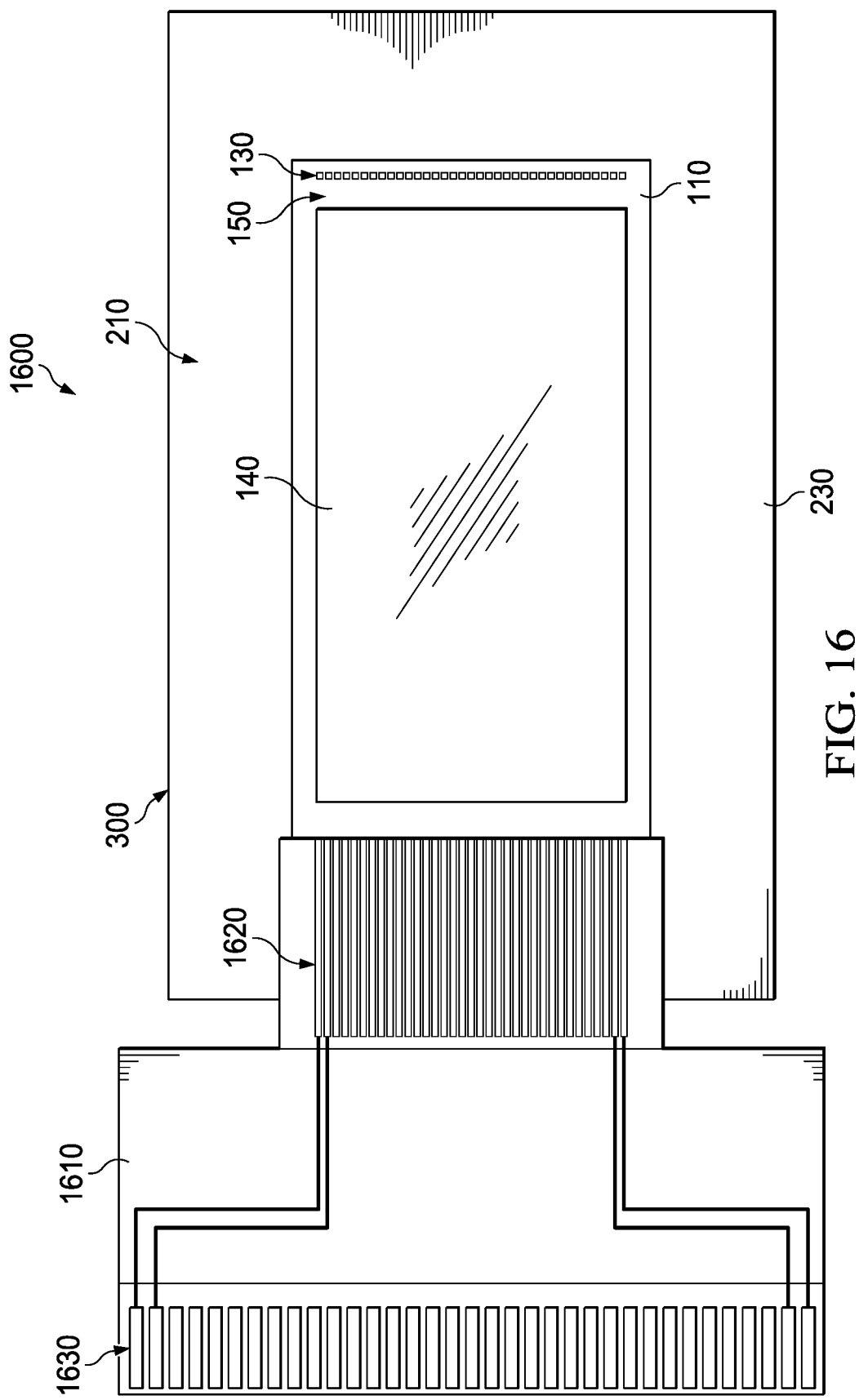
FIG. 16 illustrates a top view of a fourth example assembly including the first assembly of FIG. 3 and a third example electrical interconnect.

FIG. 16 illustrates a top view of a fourth example assembly 1600 including the first assembly 300 of FIG. 3 and a third example electrical interconnect 1610. The third electrical interconnect 1610 may be a flexible electrical interconnect. The third electrical interconnect 1610 may be manufactured out of any suitable conductive material (e.g., copper, nickel, silver, gold, etc.) and insulator, designed to electrically couple a plurality of terminals to another plurality of terminals. In the example of the FIG. 16, the third electrical interconnect 1610 includes a thirteenth plurality of terminals 1620 and a fourteenth plurality of terminals 1630. The thirteenth plurality of terminals 1620 may be electrically coupled to the fourteenth plurality of terminals 1630. In the example of FIG. 16, the third electrical interconnect 1610 is electrically coupled to the first plurality of terminals 120 of FIG. 1 (not pictured in FIG. 16 for clarity). Alternatively, the third electrical interconnect 1610 may be electrically coupled to the second plurality of terminals 130 and/or the third electrical interconnect 1610 may be replicated to be electrically coupled to the second plurality of terminals 130. The assembly apparatus 900 of FIG. 9 may be configured to electrically couple the third electrical interconnect 1610 to the first assembly 300, such that the heat provided by the heat sources 905 and 910 electrically couples the plurality of terminals 120 and 130 to 1620 without damaging the first integrated circuit 100 of FIG. 1.

Figure 17:
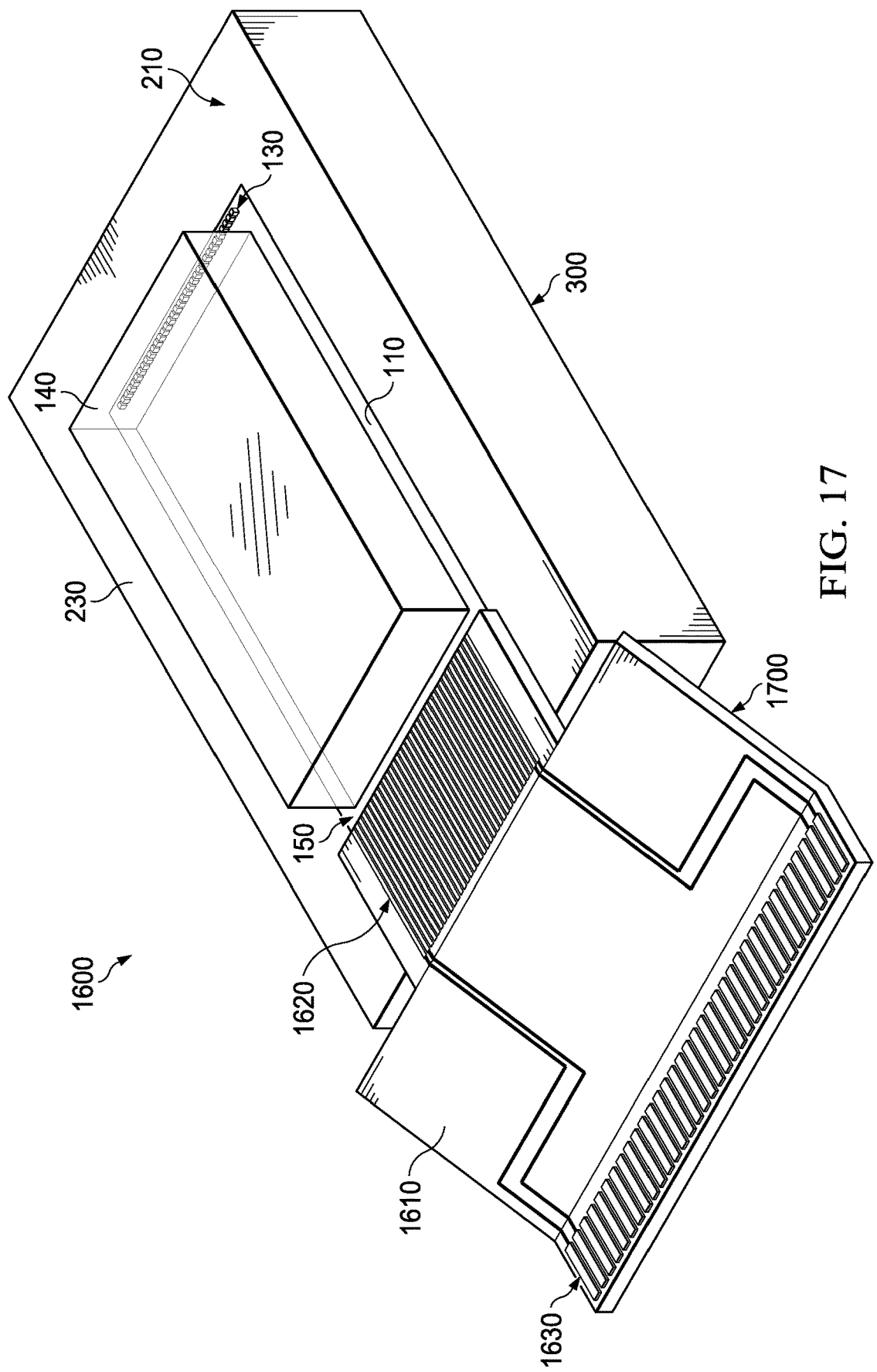
FIG. 17 illustrates an isometric view of the fourth assembly of FIG. 16.

FIG. 17 illustrates an isometric view of the fourth assembly 1600 including the first assembly 300 of FIG. 3 and the third electrical interconnect 1610 of FIG. 16. In the example of FIG. 16, the third electrical interconnect 1610 includes the thirteenth plurality of terminals 1620, the fourteenth plurality of terminals 1630, and an example surface 1700. The surface 1700 of the third electrical interconnect 1610 may include the thirteenth plurality of terminals 1620 and the fourteenth plurality of terminals 1630. The plurality of terminals 1620 and 1630 are configured to be electrically coupled by either surface of the third electrical interconnect 1610, such that the surface 1700 of the third electrical interconnect 1610 may be electrically coupled to the first plurality of terminals 120 of FIG. 1 (not pictured in FIG. 17 for clarity). The surface 1700 is mechanically coupled to the surface 150 of the first integrated circuit 100 of FIG. 1 and/or the surface 210 of the first housing 200 of FIG. 2 (not pictured in FIG. 17 for clarity). The surface 1700 may be configured to include the thirteenth plurality of terminals 1620, such that the thirteenth plurality of terminals 1620 may be electrically coupled to the first plurality of terminals 120 of FIG. 1. Alternatively, the surface 1700 may include the fourteenth plurality of terminals 1630, such that the third electrical interconnect 1610 may be electrically coupled to a third integrated circuit (not illustrated).

FIG. 18 illustrates a side view of a fifth example assembly 1800 including the fourth assembly 1600 of FIGS. 12 and 13, and a fourth example electrical interconnect 1810. As shown in the illustrated example, the fifth assembly 1800 includes the fourth assembly 1600 of FIGS. 12 and 13, the fourth electrical interconnect 1810, and a third example integrated circuit 1820. The third integrated circuit 1820 may be configured to include processing circuitry, memory, and/or additional circuitry to be electrically coupled to the first integrated circuit 100 of FIG. 1 through a plurality of terminals on the surface 1700 of the third electrical interconnect 1610. Alternatively, the second integrated circuit 1010 may be a motherboard or PCB. The first assembly 300 of FIG. 3 may be mechanically aligned to a surface 1840 of the third integrated circuit 1820, such that the third electrical interconnect 1610 and fourth electrical interconnect 1810 are aligned to be electrically coupled to the third integrated circuit 1820. The first assembly 300 may additionally be mechanically coupled to the surface 1840 with the adhesive (e.g., silicon, epoxy, acrylic, etc.) between the first assembly 300 and the surface 1840. The fourth electrical interconnect 1810 is manufactured similar (preferably identical) to that of the third electrical interconnect 1610 of FIGS. 12 and 13.

In the example of FIG. 18, the fourth electrical interconnect 1810 includes an example surface 1830. In the example of FIG. 18, the electrical interconnects 1610 and 1810 are flexible electrical interconnects. Alternatively, the electrical interconnects 1610 and 1810 may be any electrical interconnect, such that the first plurality of terminals 120 of FIG. 1 and the second plurality of terminals 130 of FIG. 1 may be electrically coupled to the surface 1840. In the example of FIG. 18, the third electrical interconnect 1610 is electrically coupled to the first plurality of terminals 120 of FIG. 1 (not pictured in FIG. 18 for clarity) and a corresponding plurality of terminals on the surface 1840. The third electrical interconnect 1610 may additionally be mechanically coupled to the surface 210 of the first housing 200 of FIG. 2 and the surface 1840. In the example of FIG. 18, the fourth electrical interconnect 1810 is electrically coupled to the second plurality of terminals 130 of FIG. 1 (not pictured in FIG. 18 for clarity) and a corresponding plurality of terminals on the surface 1840. The fourth electrical interconnect 1810 may additionally be mechanically coupled to the surface 210 of the first housing 200 and the surface 1840.

FIG. 19 is a flowchart representative of an example method to manufacture the fifth assembly 1800 of FIG. 18. The example method is adapted to manufacture any type of integrated circuit packaging including a first example integrated circuit (e.g., the first integrated circuit 100), an intermediate structural carrier (e.g., the first housing 200 of FIG. 2), and an example flexible electrical interconnect (e.g., the third electrical interconnect 1610 of FIGS. 12-14, the fourth electrical interconnect 1810 of FIG. 18, etc.) to a second integrated circuit (e.g., the third integrated circuit 1820 of FIG. 18).

In the example of FIG. 19, the process begins at block 1905 with mounting a first chip into an intermediate structural carrier. The first chip may be an integrated circuit (e.g., the first integrated circuit 100 of FIG. 1, etc.). For example, mounting the first integrated circuit 100 of FIG. 1 into the first housing 200 of FIG. 2, such that the first assembly 300 of FIG. 3 is the result. Additionally, adhesive (e.g., silicon, epoxy, acrylic, etc.) may be applied to mechanically couple the first chip and the intermediate structural carrier. The process proceeds to block 1910.

In the example of FIG. 19, at block 1910, a flexible interconnect is mounted to the first chip. For example, the electrical interconnect 1610 of FIG. 12-14 may be electrically and/or mechanically coupled to the first integrated circuit 100 using the assembly apparatus 900 of FIG. 9 configured to electrically couple the thirteenth plurality of terminals 1620 of FIGS. 12 and 13 to the first plurality of terminals 120 of FIG. 1. An additional block may be implemented to mount a second flexible interconnect to the first chip using the same method described herein for block 1910. The process proceeds to block 1915.

In the example of FIG. 19, at block 1915, the intermediate structural carrier is mounted to a second chip. For example, the first assembly 300 is mechanically coupled to the third integrated circuit 1820 of FIG. 18. Additionally, adhesive (e.g., silicon, epoxy, acrylic, etc.) may be applied between the intermediate structural carrier and the second chip. The process proceeds to block 1920.

In the example of FIG. 19, at block 1920, the flexible interconnect is electrically and/or mechanically coupled to the second chip. For example, the third electrical interconnect 1610 is electrically coupled to the third integrated circuit 1820. The fourteenth plurality of terminals 1630 of FIGS. 12 and 13 may be electrically coupled to a corresponding plurality of terminals on the surface 1840 of the third integrated circuit 1820 of FIG. 18. An additional block may be implemented to electrically and/or mechanically couple a second flexible interconnect to the second chip, such as illustrated by the fourth electrical interconnect 1810 of FIG. 18. Thereafter, the example method of FIG. 19 ends.

Although an example method is described with reference to the flowchart illustrated in FIG. 19, many other methods of manufacturing the fifth assembly 1800 of FIG. 18. For example, the order of execution of the blocks may be changed, and/or some of the blocks described may be changed, eliminated, or combined. Similarly, additional operations may be included in the manufacturing process before, in between, or after the blocks shown in the illustrated example.

FIG. 20 illustrates a side view of a sixth example assembly 2000 including the first integrated circuit 100 of FIG. 1, a plurality of electrical interconnects 2005 and 2010, and a plurality of stand-offs 2015 and 2020. As shown in the illustrated example, the sixth assembly 2000 includes the first integrated circuit 100, a fifth example electrical interconnect 2005, a sixth example electrical interconnect 2010, a first example stand-off 2015, a second example stand-off 2020, and a seventh example electrical interconnect 2025. Alternatively, the first integrated circuit 100 may be any integrated circuit. Alternatively, the seventh electrical interconnect 2025 may be an integrated circuit (e.g., the third integrated circuit 1820 of FIG. 18). Alternatively, the sixth assembly 2000 may include any number of electrical interconnects (e.g., the fifth electrical interconnect 2005 and the sixth electrical interconnect 2010) and stand-offs (e.g., the first stand-off 2015 and the second stand-off 2020).

In the example of FIG. 20, the first integrated circuit 100 includes the surface 150, the first plurality of terminals 120, the second plurality of terminals 130, the optical interface 140, a fifteenth example plurality of terminals 2030, and a sixteenth example plurality of terminals 2035. Alternatively, the first integrated circuit 100 may be implemented with the first plurality of terminals 120 and the second plurality of terminals 130, as illustrated in FIGS. 1-3. Alternatively, the first integrated circuit 100 of FIG. 1 may be implemented without the optical interface 140.

In the example of FIG. 20, the fifth electrical interconnect 2005 includes an example surface 2045. The surface 2045 of the fifth electrical interconnect 2005 may be electrically and/or mechanically coupled to the surface 150 of the first integrated circuit 100. The fifth electrical interconnect 2005 may include a plurality of terminals on the surface 2045 (not pictured for clarity) to be electrically coupled to the first plurality of terminals 120 and/or the fifteenth plurality of terminals 2030. The fifth electrical interconnect 2005 is configured to enable the optical interface 140 to be mechanically aligned.

In the example of FIG. 20, the sixth electrical interconnect 2010 includes an example surface 2050. The surface 2050 of the sixth electrical interconnect 2010 may be electrically and/or mechanically coupled to the surface 150 of the first integrated circuit 100. The sixth electrical interconnect 2010 may include a plurality of terminals on the surface 2050 (not pictured for clarity) to be electrically coupled to the second plurality of terminals 130 and/or the sixteenth plurality of terminals 2035. The sixth electrical interconnect 2010 is configured to enable the optical interface 140 to be mechanically aligned.

In the example of FIG. 20, the first stand-off 2015 includes an example surface 2055 and an example surface 2060. The surface 2055 of the first stand-off 2015 is mechanically coupled to the surface 2045 of the fifth electrical interconnect 2005. Advantageously, the first stand-off 2015 enables the assembly apparatus 900 of FIG. 9 to be configured to electrically couple the fifth electrical interconnect 2005 to the first plurality of terminals 120 and/or the fifteenth plurality of terminals 2030. Advantageously, the first stand-off 2015 increases the durability of the coupling of the fifth electrical interconnect 2005 to the first integrated circuit 100 of FIG. 1.

In the example of FIG. 20, the second stand-off 2020 includes an example surface 2065 and an example surface 2070. The surface 2065 of the second stand-off 2020 is mechanically coupled to the surface 2050 of the sixth electrical interconnect 2010. Advantageously, the second stand-off 2020 enables the assembly apparatus 900 of FIG. 9 to be configured to electrically couple the sixth electrical interconnect 2010 to the second plurality of terminals 130 and/or the sixteenth plurality of terminals 2035. Advantageously, the second stand-off 2020 increases the durability of the coupling of the sixth electrical interconnect 2010 to the first integrated circuit 100 of FIG. 1.

In the example of FIG. 20, the seventh electrical interconnect 2025 includes an example surface 2075, an example surface 2080, a seventeenth example plurality of terminals 2085, an example electrical interconnect layer 2090, an eighteenth example plurality of terminals 2092, a nineteenth example plurality of terminals 2094, a twentieth example plurality of terminals 2096, and a twenty-first plurality of terminals 2098. The first integrated circuit 100 of FIG. 1 may be mechanically coupled to the surface 2075 of the seventh electrical interconnect 2025 by a second example adhesive layer 2088 (e.g., silicon, epoxy, acrylic, etc.). Alternatively, the first integrated circuit 100 may be mechanically coupled to the surface 2075 without the second adhesive layer 2088. The surfaces 2045 and 2050 may be electrically and/or mechanically coupled to the surface 2075 of the seventh electrical interconnect 2025. The surfaces 2060 and 2070 may be mechanically coupled to the surface 2075 of the seventh electrical interconnect 2025. The surface 2080 of the seventh electrical interconnect 2025 includes the seventeenth plurality of terminals 2085. The seventeenth plurality of terminals 2085 may be electrically coupled to a plurality of terminals on the surface 2075 of the seventh electrical interconnect 2025. The seventh electrical interconnect 2025 may include the electrical interconnect layer 2090 to electrically couple the plurality of terminals 2092-2098 to the seventeenth plurality of terminals 2085. The electrical interconnect layer 2090 may be manufactured out of any suitable conductive material (e.g., copper, nickel, silver, gold, etc.) and insulator, designed to electrically couple a plurality of terminals to another plurality of terminals.

Alternatively, the seventh electrical interconnect 2025 may be an integrated circuit (e.g., the third integrated circuit 1820 of FIG. 18). Advantageously, the seventh electrical interconnect 2025 enables the first integrated circuit 100 to be electrically coupled to an integrated circuit, such that the electrical and/or optical interface of the first integrated circuit 100 may be aligned.

FIG. 21 is a flowchart representative of an example method to manufacture the sixth assembly 2000 of FIG. 20. The example method is adapted to manufacture any type of integrated circuit packaging including a chip (e.g., the first integrated circuit 100), a stand-off (e.g., the first stand-off 2015 of FIG. 20 and the second stand-off 2020 of FIG. 20), and an example flexible electrical interconnect (e.g., the third electrical interconnect 1610 of FIGS. 12-14, the fourth electrical interconnect 1810 of FIG. 18, the fifth electrical interconnect 2005 of FIG. 20, the sixth electrical interconnect 2010 of FIG. 20, etc.) to an electrical interconnect (e.g., the seventh electrical interconnect 2025 of FIG. 20). Alternatively, the electrical interconnect may be an integrated circuit (e.g., the third integrated circuit 1820 of FIG. 18).

In the example of FIG. 21, the process begins at block 2110 with mounting a chip onto an electrical interconnect. For example, mounting the first integrated circuit 100 of FIG. 1 onto the seventh electrical interconnect 2025 of FIG. 20. An adhesive layer (e.g., the second adhesive layer 2088 of FIG. 20) may be applied to mechanically couple the chip to the electrical interconnect. The process proceeds to block 2120.

In the example of FIG. 21, at block 2120, a stand-off is mounted to the electrical interconnect. For example, the first stand-off 2015 of FIG. 20 is mechanically coupled to the seventh electrical interconnect 2025. An additional block may be added to mount an additional stand-off to the electrical interconnect, such as illustrated in the sixth assembly 2000 of FIG. 20 by the sixth electrical interconnect 2010 of FIG. 20 and the second stand-off 2020 of FIG. 20. The process proceeds to block 2130.

In the example of FIG. 21, at block 2130, the flexible interconnect is mounted to the electrical interconnect. For example, the fifth electrical interconnect 2005 of FIG. 20 may be electrically and/or mechanically coupled to the seventh electrical interconnect 2025. An additional block may be added to mount an additional flexible interconnect to the electrical interconnect, such as the sixth electrical interconnect 2010 electrically and/or mechanically coupled to the seventh electrical interconnect 2025. The process proceeds to block 2140.

In the example of FIG. 21, at block 2140, the flexible interconnect is mounted to the chip. The chip of the process at block 2140 may be an integrated circuit (e.g., the third integrated circuit 1820 of FIG. 18, the seventh electrical interconnect 2025 of FIG. 20, etc.). For example, the fifth electrical interconnect 2005 of FIG. 20 may be electrically and/or mechanically coupled to the first integrated circuit 100. The block 2140 may be completed by the assembly apparatus 900 of FIG. 9 configured to electrically and/or mechanically couple the flexible interconnects to the first integrated circuit 100. An additional block may be added to mount an additional flexible interconnect to the chip, such as the sixth electrical interconnect 2010 is electrically and/or mechanically coupled to the first integrated circuit 100. Thereafter, the example method of FIG. 19 ends.

Although an example method is described with reference to the flowchart illustrated in FIG. 21, many other methods of manufacturing the sixth assembly 2000. For example, the order of execution of the blocks may be changed, and/or some of the blocks described may be changed, eliminated, or combined. Similarly, additional operations may be included in the manufacturing process before, in between, or after the blocks shown in the illustrated example.

FIG. 22 is a side view of a seventh example assembly 2200. As shown in the illustrated example, the seventh assembly 2200 includes the first integrated circuit 100, an eighth example electrical interconnect 2205, a ninth example electrical interconnect 2210, and an eleventh example electrical interconnect 2215. Alternatively, the first integrated circuit 100 may be any integrated circuit. Alternatively, the eleventh electrical interconnect 2215 may be an integrated circuit (e.g., the third integrated circuit 1820 of FIG. 18, the seventh electrical interconnect 2025 of FIG. 20, etc.). Alternatively, the seventh assembly 2200 may include any number of electrical interconnects (e.g., the fifth electrical interconnect 2005, and the sixth electrical interconnect 2010).

In the example of FIG. 22, the first integrated circuit 100 includes the surface 150, the first plurality of terminals 120, the second plurality of terminals 130, the optical interface 140, the fifteenth plurality of terminals 2030, and the sixteenth plurality of terminals 2035. Alternatively, the first integrated circuit 100 may be implemented with the first plurality of terminals 120 and the second plurality of terminals 130, as illustrated in FIGS. 1-3. Alternatively, the first integrated circuit 100 of FIG. 1 may be implemented without the optical interface 140.

In the example of FIG. 22, the eighth electrical interconnect 2205 includes an example surface 2220. The surface 2220 of the eighth electrical interconnect 2205 may be electrically and/or mechanically coupled to the surface 150 of the first integrated circuit 100. The eighth electrical interconnect 2205 may include a plurality of terminals on the surface 2220 (not pictured for clarity) to be electrically coupled to the first plurality of terminals 120 and/or the fifteenth plurality of terminals 2030. The eighth electrical interconnect 2205 is configured to enable the optical interface 140 to be mechanically aligned. The eighth electrical interconnect 2205 is electrically coupled to the plurality of terminals 120, 2030, and 2245-2250, such that the eighth electrical interconnect 2205 may bend above the surface 150 of the optical IC 110. Advantageously, the eighth electrical interconnect 2205 is configured to bend to modify the durability of the seventh assembly 2200 and enable multiple manufacturing methods.

In the example of FIG. 22, the ninth electrical interconnect 2210 includes an example surface 2225. The surface 2225 of the ninth electrical interconnect 2210 may be electrically and/or mechanically coupled to the surface 150 of the first integrated circuit 100. The ninth electrical interconnect 2210 may include a plurality of terminals on the surface 2225 (not pictured for clarity) to be electrically coupled to the second plurality of terminals 130 and/or the sixteenth plurality of terminals 2035. The ninth electrical interconnect 2210 is configured to enable the optical interface 140 to be mechanically aligned. The ninth electrical interconnect 2210 is electrically coupled to the plurality of terminals 130, 2035, and 2255-2260, such that the ninth electrical interconnect 2210 may bend above the surface 150 of the optical IC 110. Advantageously, the ninth electrical interconnect 2210 may be configured to bend to modify the durability of the seventh assembly 2200 and enable multiple manufacturing methods.

In the example of FIG. 22, the eleventh electrical interconnect 2215 includes an example surface 2230, an example surface 2235, a twenty-second example plurality of terminals 2240, a twenty-third example plurality of terminals 2245, a twenty-fourth example plurality of terminals 2250, a twenty-fifth example plurality of terminals 2255, a twenty-sixth example plurality of terminals 2260, and a second example electrical interconnect layer 2265. The first integrated circuit 100 of FIG. 1 may be mechanically coupled to the surface 2230 of the eleventh electrical interconnect 2215 by a third example adhesive layer 2270 (e.g., silicon, epoxy, acrylic, etc.). Alternatively, the first integrated circuit 100 may be mechanically coupled to the surface 2230 without the third adhesive layer 2270. The surfaces 2220 and 2225 may be electrically and/or mechanically coupled to the surface 2230 of the eleventh electrical interconnect 2215. The surface 2235 of the eleventh electrical interconnect 2215 includes the twenty-second plurality of terminals 2240. The twenty-second plurality of terminals 2240 may be electrically coupled to a plurality of terminals on the surface 2230 of the eleventh electrical interconnect 2215. The eleventh electrical interconnect 2215 may include the second electrical interconnect layer 2265 to electrically couple the plurality of terminals 2245-2260 to the twenty-second plurality of terminals 2240. The second electrical interconnect layer 2265 may be manufactured out of any suitable conductive material (e.g., copper, nickel, silver, gold, etc.) and insulator, designed to electrically couple a plurality of terminals to another plurality of terminals.

Alternatively, the eleventh electrical interconnect 2215 may be an integrated circuit (e.g., the third integrated circuit 1820 of FIG. 18). Advantageously, the eleventh electrical interconnect 2215 enables the first integrated circuit 100 to be electrically coupled to an integrated circuit, such that the electrical and/or optical interface of the first integrated circuit 100 may be aligned.

FIG. 23 is a side view of an eighth example assembly 2300. As shown in the illustrated example, the eighth assembly 2300 includes the first assembly 300, the eighth electrical interconnect 2205, the ninth electrical interconnect 2210, and the eleventh example electrical interconnect 2215.

In the example of FIG. 23, the eighth electrical interconnect 2205 is electrically coupled to the plurality of terminals 120, 2030, and 2245-2250, such that the eighth electrical interconnect 2205 may bend away from the optical IC 110. Advantageously, the eighth electrical interconnect 2205 is configured to bend to modify the durability of the eighth assembly 2300 and enable multiple manufacturing methods.

In the example of FIG. 23, the ninth electrical interconnect 2210 is electrically coupled to the plurality of terminals 130, 2035, and 2255-2260, such that the ninth electrical interconnect 2210 may bend away from the optical IC 110. Advantageously, the ninth electrical interconnect 2210 may be configured to bend to modify the durability of the eighth assembly 2300 and enable multiple manufacturing methods.

FIG. 24 is a side view of a ninth example assembly 2400. As shown in the illustrated example, the ninth assembly 2400 includes the first integrated circuit 100, the eleventh example electrical interconnect 2215, a twelfth example electrical interconnect 2405, and a thirteenth example electrical interconnect 2410. Alternatively, the seventh assembly 2200 may include any number of electrical interconnects (e.g., the fifth electrical interconnect 2005 and the sixth electrical interconnect 2010).

In the example of FIG. 24, the twelfth electrical interconnect 2405 includes a first example surface 2415 and a second example surface 2420. The first surface 2415 of the twelfth electrical interconnect 2405 may be electrically and/or mechanically coupled to the surface 150 of the first integrated circuit 100. The twelfth electrical interconnect 2405 may include a plurality of terminals on the first surface 2415 (not pictured for clarity) and the second surface 2420 (not pictured for clarity) to be electrically coupled to the first plurality of terminals 120 and/or the fifteenth plurality of terminals 2030. The twelfth electrical interconnect 2405 is configured to enable the optical interface 140 to be mechanically aligned. The twelfth electrical interconnect 2405 is electrically coupled to the plurality of terminals 120 and/or 2030 by a plurality of terminals on the first surface 2415 (not pictured for clarity) and 2245-2250 on the second surface 2420 (not pictured for clarity), such that the twelfth electrical interconnect 2405 may bend away from the optical IC 110. Advantageously, the twelfth electrical interconnect 2405 is configured to bend to modify the durability of the ninth assembly 2400 and enable multiple manufacturing methods.

In the example of FIG. 24, the thirteenth electrical interconnect 2410 includes a first example surface 2425 and a second example surface 2430. The first surface 2425 of the thirteenth electrical interconnect 2410 may be electrically and/or mechanically coupled to the surface 150 of the first integrated circuit 100. The thirteenth electrical interconnect 2410 may include a plurality of terminals on the first surface 2425 (not pictured for clarity) and the second surface 2430 (not pictured for clarity) to be electrically coupled to the second plurality of terminals 130 and/or the sixteenth plurality of terminals 2035. The thirteenth electrical interconnect 2410 is configured to enable the optical interface 140 to be mechanically aligned. The thirteenth electrical interconnect 2410 is electrically coupled to the plurality of terminals 130 and/or 2035 by a plurality of terminals on the first surface 2425 (not pictured for clarity), and 2255-2260 by a plurality of terminals on the second surface 2430 (not pictured for clarity), such that the thirteenth electrical interconnect 2410 may bend away from the optical IC 110. Advantageously, the thirteenth electrical interconnect 2410 may be configured to bend to modify the durability of the ninth assembly 2400 and enable multiple manufacturing methods.

FIG. 25 is a side view of a tenth example assembly 2500. As shown in the illustrated example, the tenth assembly 2500 includes the first integrated circuit 100, the eleventh example electrical interconnect 2215, a fourteenth example electrical interconnect 2505, a fifteenth example electrical interconnect 2510, and a second housing 2535. Alternatively, the tenth assembly 2500 may include any number of electrical interconnects (e.g., the fifth electrical interconnect 2005 and the sixth electrical interconnect 2010).

In the example of FIG. 25, the fourteenth electrical interconnect 2505 includes a first example surface 2515 and a second example surface 2520. The first surface 2515 of the fourteenth electrical interconnect 2505 may be electrically and/or mechanically coupled to the surface 150 of the first integrated circuit 100. The fourteenth electrical interconnect 2505 may include a plurality of terminals on the first surface 2515 (not pictured for clarity) and the second surface 2520 (not pictured for clarity) to be electrically coupled to the first plurality of terminals 120 and/or the fifteenth plurality of terminals 2030. The fourteenth electrical interconnect 2505 is configured to enable the optical interface 140 to be mechanically aligned. The fourteenth electrical interconnect 2505 is electrically coupled to the plurality of terminals 120 and/or 2030 by a plurality of terminals on the first surface 2515 (not pictured for clarity) and 2245-2250 on the second surface 2520 (not pictured for clarity), such that the fourteenth electrical interconnect 2505 may bend away from the optical IC 110. Advantageously, the fourteenth electrical interconnect 2505 is configured to bend to modify the durability of the tenth assembly 2500 and enable multiple manufacturing methods.

In the example of FIG. 25, the fifteenth electrical interconnect 2510 includes a first example surface 2525 and a second example surface 2530. The first surface 2525 of the fifteenth electrical interconnect 2510 may be electrically and/or mechanically coupled to the surface 150 of the first integrated circuit 100. The fifteenth electrical interconnect 2510 may include a plurality of terminals on the first surface 2525 (not pictured for clarity) and the second surface 2530 (not pictured for clarity) to be electrically coupled to the second plurality of terminals 130 and/or the sixteenth plurality of terminals 2035. The fifteenth electrical interconnect 2510 is configured to enable the optical interface 140 to be mechanically aligned. The fifteenth electrical interconnect 2510 is electrically coupled to the plurality of terminals 130 and/or 2035 by a plurality of terminals on the first surface 2525 (not pictured for clarity), and 2255-2260 by a plurality of terminals on the second surface 2530 (not pictured for clarity), such that the fifteenth electrical interconnect 2510 may bend away from the optical IC 110. Advantageously, the fifteenth electrical interconnect 2510 may be configured to bend to modify the durability of the tenth assembly 2500 and enable multiple manufacturing methods.

In the example of FIG. 25, the second housing 2535 is configured to mechanically couple the first integrated circuit 100 to the eleventh electrical interconnect 2215. The second housing 2535 is mechanically aligned, such that the optical interface 140 may be aligned with the desired location of the optical output. The second housing 2535 is manufactured as an insulator (e.g., epoxy material, etc.). The second housing is manufactured to house a portion of the first assembly 300, such that the electrical interconnects 2505 and 2510 may not be in contact with the second housing 2535. Advantageously, the second housing 2535 enables multiple manufacturing methods to mechanically align and/or couple the first integrated circuit 100 to the eleventh electrical interconnect 2215.

FIG. 26 is a side view of an eleventh example assembly 2600. As shown in the illustrated example, the eleventh example assembly 2600 includes the first integrated circuit 100, the eighth electrical interconnect 2205, the ninth electrical interconnect 2210, a sixteenth example electrical interconnect 2605, and an example interconnect layer 2610. The interconnect layer 2610 may be manufactured from a conductive film (e.g., solder paste, conductive adhesive, low temperature silver epoxy, etc.), such that a plurality of terminals from the first integrated circuit 100 may be mechanically and/or electrically coupled to the sixteenth electrical interconnect 2605.

In the example of FIG. 26, the sixteenth electrical interconnect 2605 includes a first example surface 2615, a second example surface 2620, a twenty-seventh example plurality of terminals 2625, a twenty-eighth example plurality of terminals 2630, a twenty-ninth example plurality of terminals 2635, a thirtieth plurality of terminals 2640, a thirty-first plurality of terminals 2645, a thirty-second plurality of terminals 2650, and a third electrical interconnect layer 2655. The sixteenth electrical interconnect 2605 may include the third electrical interconnect layer 2655 to electrically couple the plurality of terminals 2630-2650 to the twenty-seventh plurality of terminals 2625. The third electrical interconnect layer 2655 may be manufactured out of any suitable conductive material (e.g., copper, nickel, silver, gold, etc.) and insulator, designed to electrically couple a plurality of terminals to another plurality of terminals. Advantageously, the sixteenth electrical interconnect 2605 enables the first integrated circuit 100 to be implemented as an integrated circuit with a plurality of terminals electrically and/or mechanically coupled directly to the sixteenth electrical interconnect 2605.

Figure 27:
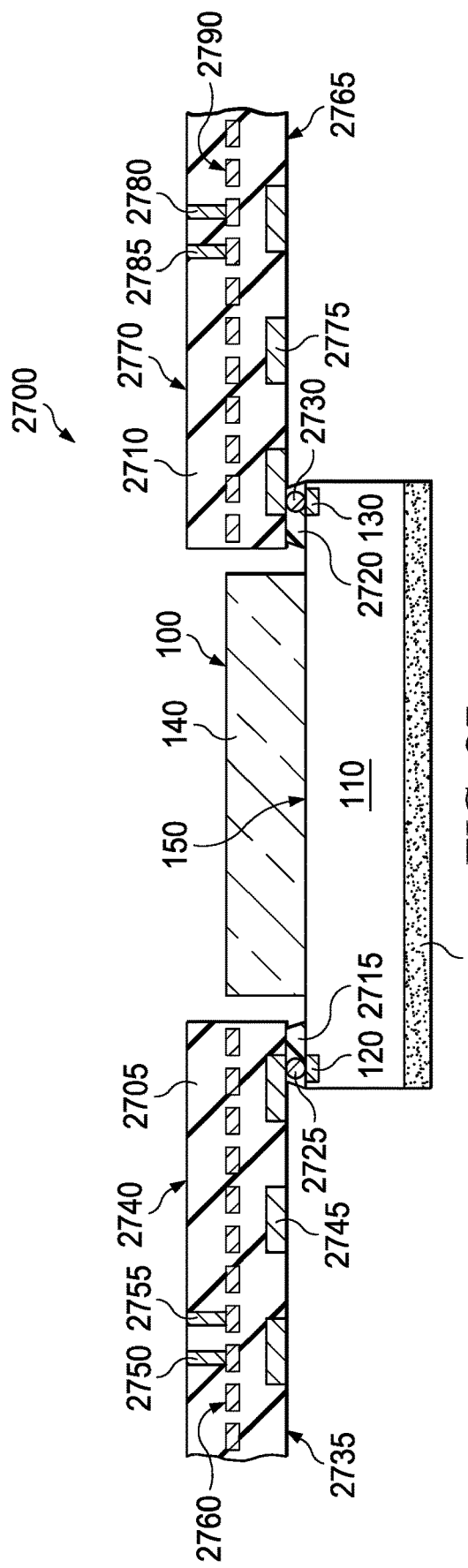
FIG. 27 is a side view of a twelfth example assembly.

FIG. 27 is a cross-sectional view of a twelfth example assembly 2700. As shown in the illustrated example, the twelfth example assembly 2700 includes the first integrated circuit 100, the third adhesive layer 2270, a seventeenth example electrical interconnect 2705, an eighteenth example electrical interconnect 2710, a first mechanical interconnect 2715, a second mechanical interconnect 2720, a nineteenth example electrical interconnect 2725, and a twentieth example electrical interconnect 2730. The mechanical interconnects 2715 and 2720 may be manufactured as an insulator (e.g., epoxy, etc.), such that each terminal of the plurality of terminals 120 and 130 may each be electrically coupled.

In the example of FIG. 27, the seventeenth electrical interconnect 2705 includes a first example surface 2735, a second example surface 2740, a thirty-third plurality of terminal 2745, a thirty-fourth plurality of terminals 2750, a thirty-fifth plurality of terminals 2755, and a fourth electrical interconnect layer 2760. The seventeenth electrical interconnect 2705 may include the fourth electrical interconnect layer 2760 to electrically couple the plurality of terminals 2745-2755 to the nineteenth electrical interconnect 2725. The fourth electrical interconnect layer 2760 may be manufactured out of any suitable conductive material (e.g., copper, nickel, silver, gold, etc.) and insulator, designed to electrically couple a plurality of terminals to another plurality of terminals or electrical interconnect.

In the example of FIG. 27, the eighteenth electrical interconnect 2710 includes a first example surface 2765, a second example surface 2770, a thirty-sixth plurality of terminal 2775, a thirty-seventh plurality of terminals 2780, a thirty-eighth plurality of terminals 2785, and a fifth electrical interconnect layer 2790. The eighteenth electrical interconnect 2710 may include the fifth electrical interconnect layer 2790 to electrically couple the plurality of terminals 2775-2785 to the twentieth electrical interconnect 2730. The fifth electrical interconnect layer 2790 may be manufactured out of any suitable conductive material (e.g., copper, nickel, silver, gold, etc.) and insulator, designed to electrically couple a plurality of terminals to another plurality of terminals or electrical interconnect.

In the example of FIG. 27, the first mechanical interconnect 2715 may be configured to encase the nineteenth electrical interconnect 2725, such that the first plurality of terminals 120 may be electrically coupled to the seventeenth electrical interconnect 2705. The second mechanical interconnect 2720 may be configured to encase the twentieth electrical interconnect 2730, such that the second plurality of terminals 130 may be electrically coupled to the eighteenth electrical interconnect 2710. Advantageously, the mechanical interconnects 2715 and 2720 may be configured to modify the durability of the twelfth assembly 2700.

Figure 28:
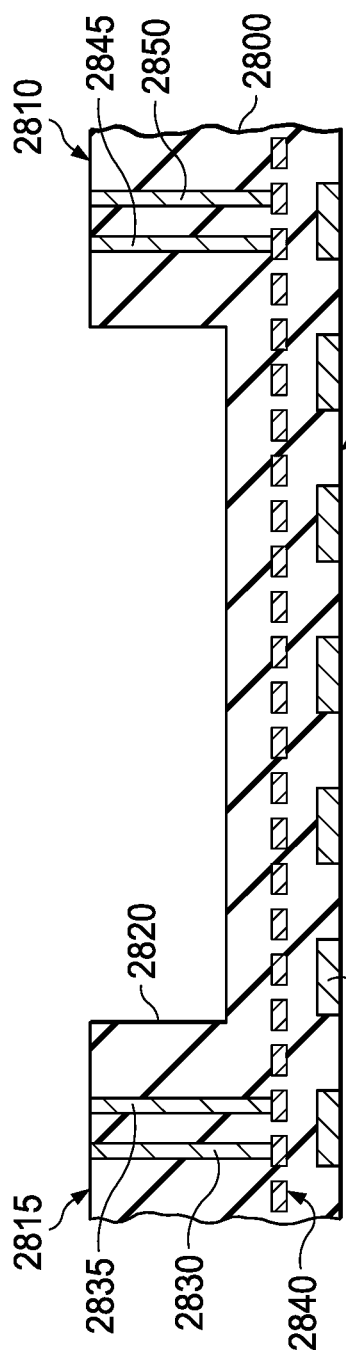
FIG. 28 is a side view of a third example housing.

FIG. 28 is a side view of a third example housing 2800. As shown in the illustrated example, the third housing 2800 includes a first example surface 2805, a second example surface 2810, a third example surface 2815, a fifth example opening 2820, a thirty-ninth example plurality of terminals 2825, a fortieth example plurality of terminals 2830, a forty-first example plurality of terminals 2835, a sixth example electrical interconnect layer 2840, a forty-second example plurality of terminals 2845, and a forty-third example plurality of terminals 2850. The third housing 2800 may include the sixth electrical interconnect layer 2840 to electrically couple the plurality of terminals 2830, 2835, 2845, and 2850 to the thirty-ninth plurality of terminals 2825. The sixth electrical interconnect layer 2840 may be manufactured out of any suitable conductive material (e.g., copper, nickel, silver, gold, etc.) and insulator, designed to electrically couple a plurality of terminals to another plurality of terminals or electrical interconnect.

In the example of FIG. 28, the surfaces 2815 and 2810 may be configured to be flush within respect to each other. The fifth opening 2820 is configured to house an integrated circuit (e.g., the first integrated circuit 100 of FIG. 1). Advantageously, the third housing 2800 may be manufactured using multiple methods.

Figure 29:
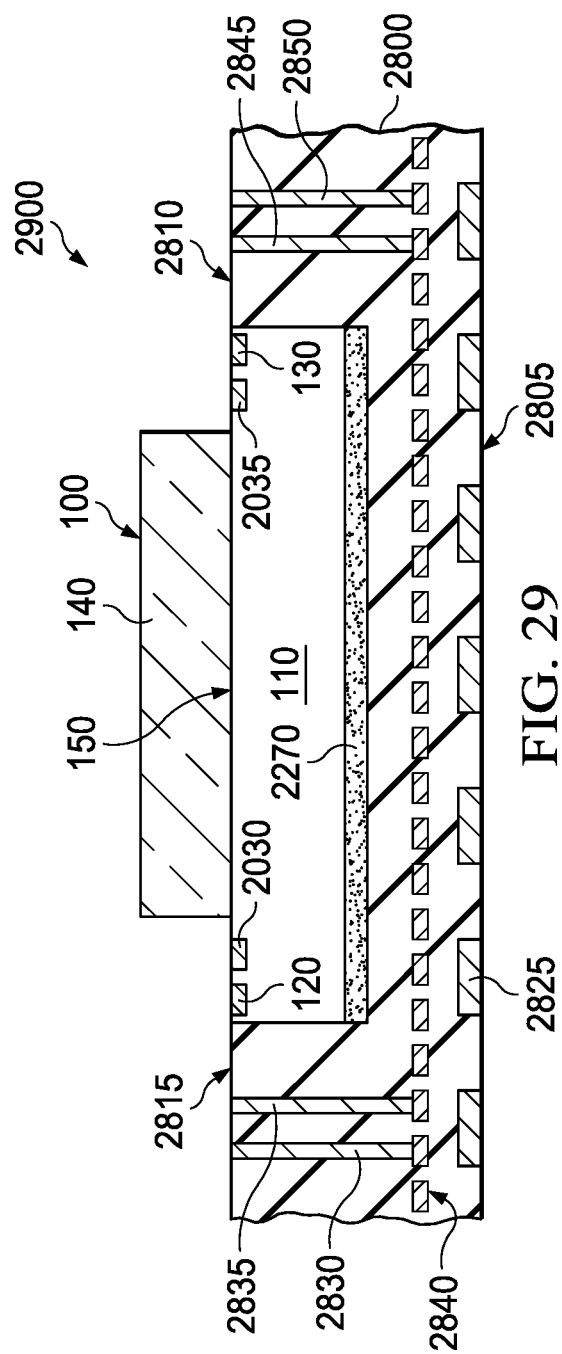
FIG. 29 is a side view of a thirteenth example assembly including the third housing of FIG. 28.

FIG. 29 is a side view of a thirteenth example assembly 2900. As shown in the illustrated example, the thirteenth assembly 2900 includes the first integrated circuit 100, the third adhesive layer 2270, and the third housing 2800. The first integrated circuit 100 may be mechanically coupled to the third housing 2800, such that the third adhesive layer 2270 separates the first integrated circuit 100 and the third housing 2800. The surface 150 of the first integrated circuit 100 may be flush to the surface 2810 and 2815 of the third housing 2800.

Figure 30:
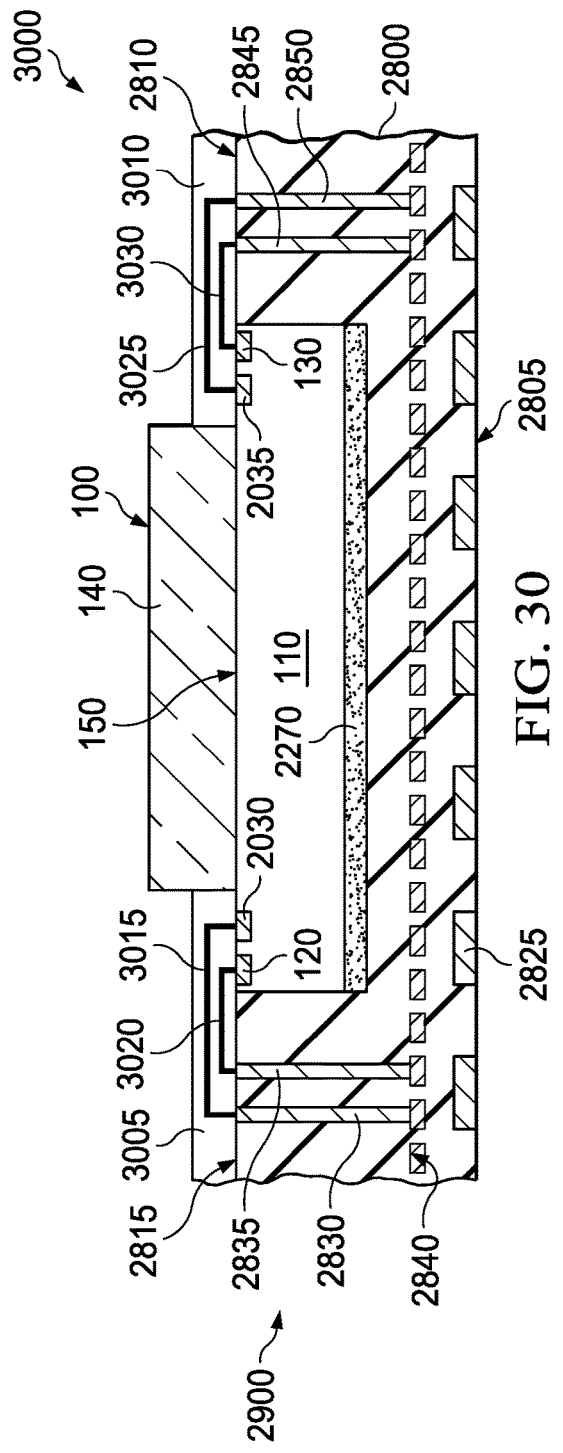
FIG. 30 is a side view of a fourteenth example assembly including the thirteenth assembly of FIG. 29.

FIG. 30 is a side view of a fourteenth example assembly 3000 including the thirteenth assembly 2900. As shown in the illustrated example, the fourteenth assembly 3000 includes the first integrated circuit 100, the third housing 2800, a twenty-first example electrical interconnect 3005, and a twenty-second electrical interconnect 3010.

In the example of FIG. 30, the twenty-first electrical interconnect 3005 includes a first example plurality of electrical traces 3015, and a second example plurality of electrical traces 3020. The first plurality of electrical traces 3015 may be configured to be electrically coupled to the fifteenth plurality of terminals 2030 and the fortieth plurality of terminals 2830. The first plurality of electrical traces 3015 may be manufactured out of any suitable conductive material (e.g., copper, nickel, silver, gold, etc.), designed to electrically couple a plurality of terminals to another plurality of terminals. The second plurality of electrical traces 3020 may be configured to be electrically coupled to the first plurality of terminals 120 and the forty-first plurality of terminals 2835. The second plurality of electrical traces 3020 may be manufactured out of any suitable conductive material (e.g., copper, nickel, silver, gold, etc.), designed to electrically couple a plurality of terminals to another plurality of terminals.

In the example of FIG. 30, the twenty-second electrical interconnect 3010 includes a third example plurality of electrical traces 3025, and a fourth example plurality of electrical traces 3030. The third plurality of electrical traces 3025 may be configured to be electrically coupled to the sixteenth plurality of terminals 2035 and the forty-third plurality of terminals 2850. The third plurality of electrical traces 3025 may be manufactured out of any suitable conductive material (e.g., copper, nickel, silver, gold, etc.), designed to electrically couple a plurality of terminals to another plurality of terminals. The fourth plurality of electrical traces 3030 may be configured to be electrically coupled to the second plurality of terminals 130 and the forty-second plurality of terminals 2845. The fourth plurality of electrical traces 3030 may be manufactured out of any suitable conductive material (e.g., copper, nickel, silver, gold, etc.), designed to electrically couple a plurality of terminals to another plurality of terminals.

Figure 31:
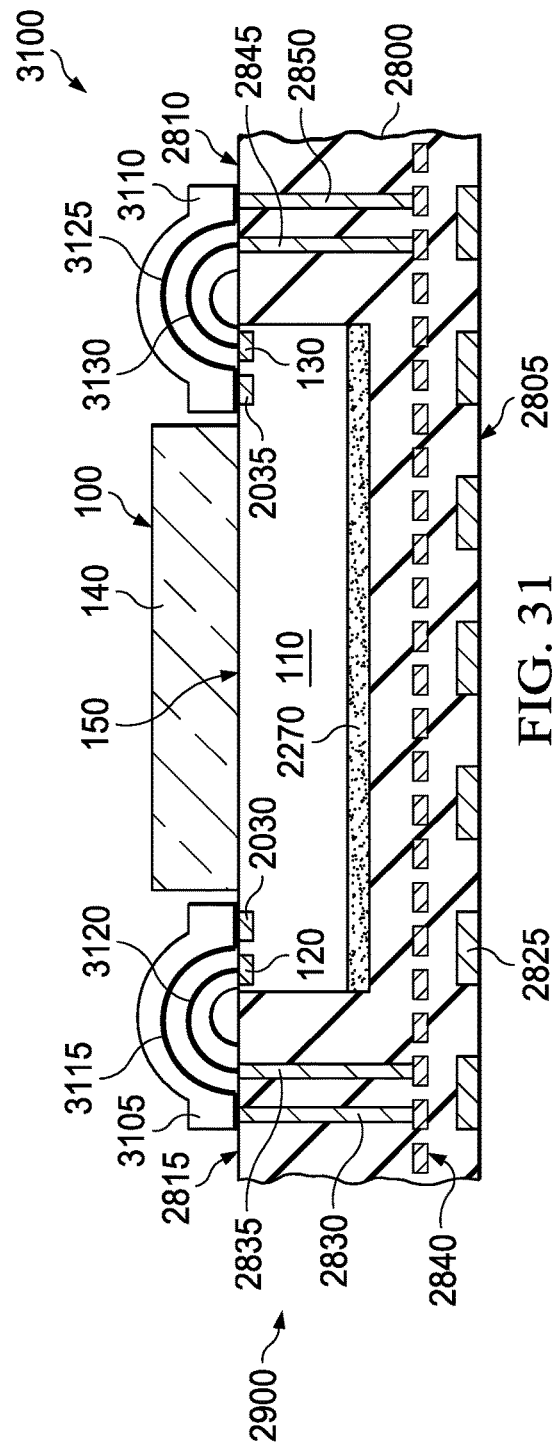
FIG. 31 is a side view of a fifteenth example assembly including the thirteenth assembly of FIG. 29.

FIG. 31 is a side view of a fifteenth example assembly 3100 including the third housing 2800. As shown in the illustrated example, the fifteenth assembly 3100 includes the first integrated circuit 100, the third housing 2800, a twenty-third example electrical interconnect 3105, and a twenty-fourth electrical interconnect 3110.

In the example of FIG. 31, the twenty-third electrical interconnect 3105 includes a fifth example plurality of electrical traces 3115, and a sixth example plurality of electrical traces 3120. The fifth plurality of electrical traces 3115 may be configured to be electrically coupled to the fifteenth plurality of terminals 2030 and the fortieth plurality of terminals 2830. The fifth plurality of electrical traces 3115 may be manufactured out of any suitable conductive material (e.g., copper, nickel, silver, gold, etc.), designed to electrically couple a plurality of terminals to another plurality of terminals. The sixth plurality of electrical traces 3120 may be configured to be electrically coupled to the first plurality of terminals 120 and the forty-first plurality of terminals 2835. The sixth plurality of electrical traces 3120 may be manufactured out of any suitable conductive material (e.g., copper, nickel, silver, gold, etc.), designed to electrically couple a plurality of terminals to another plurality of terminals.

In the example of FIG. 31, the twenty-fourth electrical interconnect 3110 includes a seventh example plurality of electrical traces 3125, and an eighth example plurality of electrical traces 3130. The seventh plurality of electrical traces 3125 may be configured to be electrically coupled to the sixteenth plurality of terminals 2035 and the forty-third plurality of terminals 2850. The seventh plurality of electrical traces 3125 may be manufactured out of any suitable conductive material (e.g., copper, nickel, silver, gold, etc.), designed to electrically couple a plurality of terminals to another plurality of terminals. The eighth plurality of electrical traces 3130 may be configured to be electrically coupled to the second plurality of terminals 130 and the forty-second plurality of terminals 2845. The eighth plurality of electrical traces 3130 may be manufactured out of any suitable conductive material (e.g., copper, nickel, silver, gold, etc.), designed to electrically couple a plurality of terminals to another plurality of terminals.

In the example of FIG. 31, the electrical interconnects 3105 and 3110 are configured to bend away from surface 2810 and 2815. The electrical interconnects Advantageously, by bending the electrical interconnects 3105 and 3110, the durability of the fifteenth assembly 3100 may be modified.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
an integrated circuit having a first surface and terminals on the first surface;
a housing at least partially laterally surrounding the integrated circuit, the housing exposing the first surface; and
an electrical interconnect having a second surface and an opening, the second surface electrically coupled to the terminals on the first surface of the integrated circuit, the second surface contacting the housing, the opening exposing the first surface.

2. The apparatus of claim 1, wherein the integrated circuit comprises an optical device.

3. The apparatus of claim 1, wherein the integrated circuit includes a conductive film between the first surface of the integrated circuit and the second surface of the electrical interconnect.

4. The apparatus of claim 1, wherein the integrated circuit includes a plurality of terminals on the first surface.

5. The apparatus of claim 1, wherein the housing includes a third surface contacting the second surface of the electrical interconnect.

6. The apparatus of claim 1, wherein the electrical interconnect includes the opening to expose an optical interface on the first surface of the integrated circuit.

7. The apparatus of claim 1, wherein the electrical interconnect includes a first plurality of terminals and a second plurality of terminals on the second surface.

8. The apparatus of claim 1, wherein the electrical interconnect includes a third surface, the opening configured to extend from the second surface to the third surface.

9. An apparatus comprising:
a first integrated circuit having a first surface;
a housing at least partially laterally surrounding the first integrated circuit, the housing having a second surface;
an electrical interconnect having a third surface, the third surface electrically coupled to the first surface, the third surface contacting the second surface; and
a second integrated circuit having a fourth surface, the fourth surface on the second surface, the fourth surface electrically coupled to the third surface.

10. The apparatus of claim 9, wherein the first integrated circuit is an optical device.

11. The apparatus of claim 9, wherein the first integrated circuit includes a plurality of terminals on the first surface.

12. The apparatus of claim 9, wherein the housing includes a fifth surface contacting to the third surface.

13. The apparatus of claim 9, wherein the electrical interconnect includes a first plurality of terminals and a second plurality of terminals on the third surface.

14. The apparatus of claim 9, wherein the second integrated circuit includes a plurality of terminals on the fourth surface.

15. An apparatus comprising:
an integrated circuit including a first surface and a second surface;
a stand-off including a first surface and a second surface; and
an electrical interconnect having a first surface and a second surface, the first surface contacting first surface of the stand-off, the second surface contacting the second surface of the stand-off, the electrical interconnect electrically coupled to the second surface of the integrated circuit and to the first surface of the electrical interconnect.

16. The apparatus of claim 15, wherein the integrated circuit is an optical device.

17. The apparatus of claim 15, wherein the first surface of the integrated circuit is coupled to the first surface of the electrical interconnect through adhesive.

18. The apparatus of claim 15, wherein the integrated circuit includes a plurality of terminals on the second surface of the integrated circuit.

19. The apparatus of claim 15, wherein the electrical interconnect includes a plurality of terminals on a third surface.

20. The apparatus of claim 15, wherein the electrical interconnect includes a fourth surface further including a plurality of terminals.

* * * * *